US008846546B2

(12) United States Patent
Takeda

(10) Patent No.: US 8,846,546 B2
(45) Date of Patent: Sep. 30, 2014

(54) METHOD OF MANUFACTURING SEMICONDUCTOR DEVICE, SUBSTRATE PROCESSING METHOD, SUBSTRATE PROCESSING APPARATUS AND RECORDING MEDIUM

(71) Applicant: Hitachi Kokusai Electric Inc., Tokyo (JP)

(72) Inventor: Tsuyoshi Takeda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 23 days.

(21) Appl. No.: 13/626,889

(22) Filed: Sep. 26, 2012

(65) Prior Publication Data

US 2013/0102132 A1    Apr. 25, 2013

(30) Foreign Application Priority Data

Oct. 21, 2011    (JP) .................................. 2011-231649
Aug. 27, 2012    (JP) .................................. 2012-186394

(51) Int. Cl.
| | |
|---|---|
| *C23C 16/455* | (2006.01) |
| *H01L 21/314* | (2006.01) |
| *H01L 21/205* | (2006.01) |
| *H01L 21/02* | (2006.01) |
| *C23C 16/32* | (2006.01) |
| *C23C 16/44* | (2006.01) |

(52) U.S. Cl.
CPC .... *H01L 21/02529* (2013.01); *H01L 21/02126* (2013.01); *H01L 21/02271* (2013.01); *C23C 16/325* (2013.01); *C23C 16/4408* (2013.01); *C23C 16/45523* (2013.01); *H01L 21/0262* (2013.01)
USPC ...... 438/778; 118/715; 118/706; 427/249.15; 257/E21.269

(58) Field of Classification Search
USPC .................................................. 438/758, 786
See application file for complete search history.

(56) References Cited

U.S. PATENT DOCUMENTS

2010/0233886 A1*  9/2010  Yang et al. ..................... 438/786
2011/0021033 A1*  1/2011  Ikeuchi et al. ................. 438/758

FOREIGN PATENT DOCUMENTS

| JP | 2001-358137 A | 12/2001 |
| JP | 2003-188400 A | 7/2003 |
| JP | 2006-156664 A | 6/2006 |
| JP | 2010-275602 | 12/2010 |
| KR | 2011-0009624 | 1/2011 |

OTHER PUBLICATIONS

English language translation of the following: Office action dated Sep. 26, 2013 from the KPO in a Korean patent application corresponding to the instant patent application. The office action translation is submitted now in order to supplement the understanding of patent document KR2011-0009624 and JP2010-275602 which are cited in the office action and are being disclosed in the instant Information Disclosure Statement.

* cited by examiner

*Primary Examiner* — Colleen Matthews
*Assistant Examiner* — Regan J Rundio
(74) *Attorney, Agent, or Firm* — SOLARIS Intellectual Property Group, PLLC

(57) ABSTRACT

A method of manufacturing a semiconductor device includes: accommodating a substrate in a processing chamber; and supplying an organosilicon-based gas into the processing chamber that is heated to form a film including silicon and carbon on the substrate. In the forming of the film including silicon and carbon, a cycle is performed a predetermined number of times. The cycle includes supplying the organosilicon-based gas into the processing chamber and confining the organosilicon-based gas in the processing chamber, maintaining a state in which the organosilicon-based gas is confined in the processing chamber, and exhausting an inside of the processing chamber.

17 Claims, 14 Drawing Sheets

METHOD OF MANUFACTURING SEMICONDUCTOR DEVICE, SUBSTRATE PROCESSING METHOD, SUBSTRATE PROCESSING APPARATUS AND RECORDING MEDIUM

CROSS-REFERENCE TO RELATED APPLICATION

This application claims priority under 35 USC 119 from Japanese Patent Application No. 2011-231649 filed on Oct. 21, 2011 and Japanese Patent Application No. 2012-186394 filed on Aug. 27, 2012, the disclosures of which are incorporated by reference herein.

BACKGROUND

Related Art

The present invention relates to a manufacturing method of a semiconductor device, a method of processing a substrate, a substrate processing apparatus and a recording medium, and more particularly, to a manufacturing method of a semiconductor device and a method of processing a substrate that include a process of forming an SiC-based film of SiC or the like, a substrate processing apparatus that is suitably used for this process and a non-transitory computer-readable recording medium.

An SiC-based film such as SiC is an insulation film having high resistances against etching and oxidation, and may be applied to a transistor gate peripheral or a wiring structure.

In recent years, the demand for miniaturization and high performance of a semiconductor device has been increased. In order to satisfy this demand, a low temperature manufacturing technique of the semiconductor device is required. Accordingly, a low temperature film forming of an SiC-based film is also required.

However, when the SiC-based film is formed at a low temperature region, it is difficult to obtain an SiC-based film having appropriate characteristics.

SUMMARY

An advantage of some aspects of the invention is to provide a semiconductor device manufacturing method, a method of processing a substrate, a substrate processing apparatus that are capable of forming an SiC-based film having appropriate characteristics at a low temperature region and a computer-readable recording medium.

According to an aspect of the present invention, there is provided a method of manufacturing a semiconductor device including:
accommodating a substrate in a processing chamber; and
supplying an organosilicon-based gas into the processing chamber that is heated to form a film including silicon and carbon on the substrate, wherein
in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

According to another aspect of the present invention, there is provided a substrate processing method including:
accommodating a substrate in a processing chamber; and
supplying an organosilicon-based gas into the processing chamber that is heated to form a film including silicon and carbon on the substrate, wherein
in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

According to a still another aspect of the present invention, there is provided a substrate processing apparatus including:
a processing chamber that accommodates a substrate;
a heater that heats an inside of the processing chamber;
an organosilicon-based gas supply system that supplies an organosilicon-based gas into the processing chamber;
an exhaust system that exhausts the inside of the processing chamber; and
a control section configured to control the heater, the organosilicon-based gas supply system and the exhaust system so as to perform supplying the organosilicon-based gas into the processing chamber that accommodates the substrate and is heated to form a film including silicon and carbon on the substrate, and at this time, so as to perform a cycle a predetermined number of times, the cycle including supplying the organosilicon-based gas into the processing chamber and confining the organosilicon-based gas in the processing chamber, maintaining a state in which the organosilicon-based gas is confined in the processing chamber, and exhausting the inside of the processing chamber.

According to a still another aspect of the present invention, there is provided a non-transitory computer-readable medium storing a program that causes a computer to perform a process including:
accommodating a substrate in a processing chamber of a substrate processing apparatus; and
supplying an organosilicon-based gas into the processing chamber that is heated to form a film including silicon and carbon on the substrate, wherein
in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

BRIEF DESCRIPTION OF THE DRAWINGS

Exemplary embodiments of the present invention will be described in detail based on the following figures, wherein.

DETAILED DESCRIPTION

Hereinafter, preferred exemplary embodiments of the present invention will be described.

The present inventors have studied a technique of forming an SiC-based film of SiC or the like at low temperature using a silicon-based gas and consequently have found that it is possible to form an SiC-based film without using plasma even at a low temperature region by using a silicon-based gas containing carbon, that is, an organosilicon-based gas and a hydrogen-containing gas. That is, the inventors have found that it is possible to thermally decompose an organosilicon-based gas to enter an active state of radicals or the like, and to cause an appropriate reaction in a gas phase or on a substrate even at the low temperature region, thereby forming an SiC-based film having appropriate characteristics. The preferred exemplary embodiments of the present invention are based on this knowledge found by the present inventors.

In the present specification, the term "SiC-based film" means a film including at least silicon (Si) and carbon (C), and the film may include a silicon oxycarbide film (SiOC film), a silicon carbonitride film (SiCN film), a silicon oxycarbonitride film (SiOCN film) and the like, for example, in addition to a silicon carbide film (SiC film).

Hereinafter, the preferred exemplary embodiments of the present invention will be described in detail with reference to the accompanying drawings.

Figure 1:
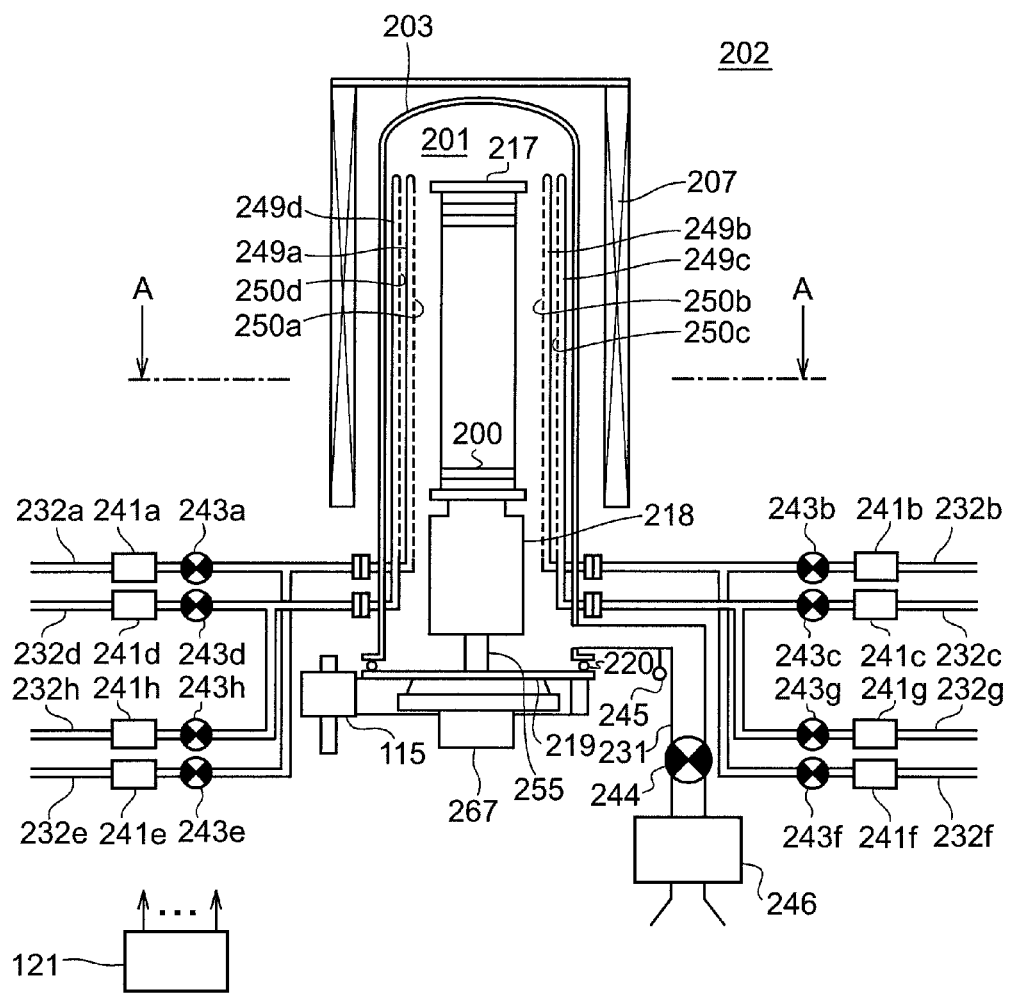
FIG. 1 is a diagram illustrating a schematic configuration of a vertical processing furnace of a substrate processing apparatus which is preferably used in an exemplary embodiment of the present invention, in which a processing furnace part is shown in a longitudinal cross-sectional view.
Figure 2:
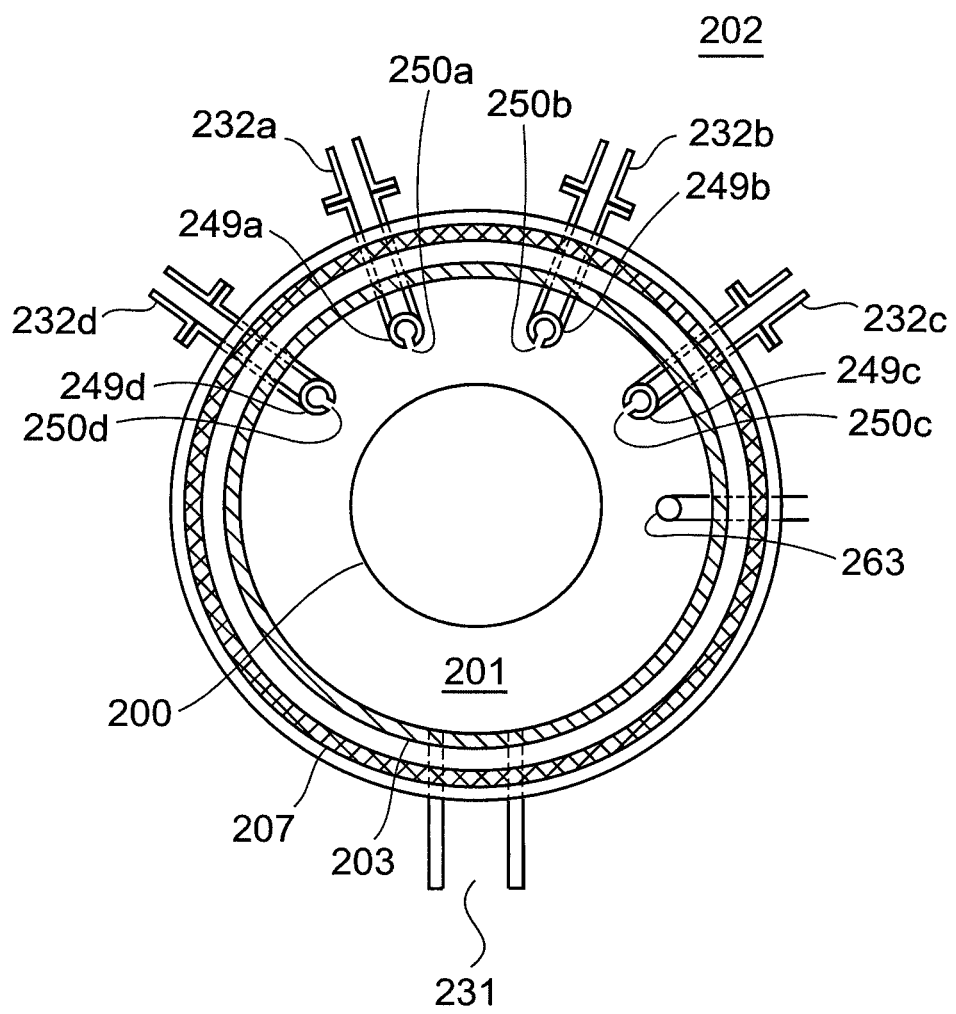
FIG. 2 is a diagram illustrating a schematic configuration of a vertical processing furnace of a substrate processing apparatus which is preferably used in an exemplary embodiment of the present invention, in which a processing furnace part is shown in a cross-sectional view taken along line A-A in FIG. 1.

FIG. 1 is a diagram illustrating a schematic configuration of a vertical processing furnace of a substrate processing apparatus which is suitably used in a preferred exemplary embodiment of the present invention, in which the part of a processing furnace 202 is shown in a longitudinal cross-sectional view. FIG. 2 is a diagram illustrating a schematic configuration of the vertical processing furnace of the substrate processing apparatus which is suitably used in the preferred exemplary embodiment of the present invention, in which the part of the processing furnace 202 is shown in a cross-sectional view taken along line A-A in FIG. 1.

As shown in FIG. 1, the processing furnace 202 has a heater 207 which is heating means (heating mechanism). The heater 207 has a cylindrical shape, and is vertically mounted by being supported by a heater base (not shown) which is a holding plate. The heater 207 also functions as an activation mechanism that decomposes and activates gas by heat, as described later.

A reaction tube 203 that forms a reaction container (processing container) is concentrically installed inside the heater 207. The reaction tube 203 is made of a heat-resistant material such as quartz ($SiO_2$) or silicon carbide (SiC), for example, and has a cylindrical shape in which an upper end thereof is closed and a lower end thereof is opened. A processing chamber 201 is formed in a hollow part of the reaction tube 203, and is configured to accommodate wafers 200 which are substrates in a state where the wafers 200 are vertically aligned at multiple stages in a horizontal posture by a board 217 (which will be described later).

A first nozzle 249a, a second nozzle 249b, a third nozzle 249c and a fourth nozzle 249d are disposed in the processing chamber 201, which are respectively installed to go through a lower part of the reaction tube 203. A first gas supply tube 232a, a second gas supply tube 232b, a third gas supply tube 232c and a fourth gas supply tube 232d are respectively connected to the first nozzle 249a, the second nozzle 249b, the third nozzle 249c and the fourth nozzle 249d. In this way, four nozzles 249a, 249b, 249c and 249d and four gas supply tubes 232a, 232b, 232c and 232d are installed in the reaction tube 203, and are configured to be able to supply plural types of gases, here, four types of gases into the processing chamber 201. A manifold made of metal that supports the reaction tube 203 may be installed under the reaction tube 203 so that each nozzle is installed to go through a side wall of the metallic manifold. In this case, an exhaust pipe 231 (which will be described later) may be further installed in the metallic manifold. Further, in this case, the exhaust pipe 231 may be installed in a lower part of the reaction tube 203 instead of the metallic manifold. In this way, a furnace port part of the processing furnace may be made of metal, and the nozzles or the like may be attached to the metallic furnace port part.

A mass flow controller (MFC) 241a which is a flow rate controller (flow rate control section) and a valve 243a which is an on-off valve are installed in the first gas supply tube 232a sequentially from the upstream direction. Further, a first inert gas supply tube 232e is connected to a downstream side with reference to the valve 243a of the first gas supply tube 232a. A mass flow controller 241e which is a flow rate controller (flow rate control section) and a valve 243e which is an on-off valve are installed in the first inert gas supply tube 232e sequentially from the upstream direction. Further, the above-mentioned first nozzle 249a is connected to a tip end part of the first gas supply tube 232a. The first nozzle 249a is installed to stand up in a loading direction of the wafer 200, along an upper part from a lower part of the reaction tube 203 on an inner wall, in an arc-shaped space between the inner wall of the reaction tube 203 and the wafer 200. That is, the first nozzle 249a is installed beside a wafer arrangement area where the wafers 200 are arranged, in an area that horizontally surrounds the wafer arrangement area, along the wafer arrangement area. The first nozzle 249a is configured as an L shaped long nozzle, has a horizontal part installed to go through a lower side wall of the reaction tube 203 and a vertical part installed to rise at least from one end side to the other end side of the wafer arrangement area. A gas supply port 250a for gas supply is formed in a side surface of the first nozzle 249a. The gas supply port 250a is opened to direct toward the center of the reaction tube 203. Plural gas supply ports 250a are installed over the upper part from the lower part of the reaction tube 203, have the same aperture area, and are installed with the same aperture pitch. Mainly, a first gas supply system is configured by the first gas supply tube 232a, the mass flow controller 241a, the valve 243a and the first nozzle 249a. Further, a first inert gas supply system is mainly configured by the first inert gas supply tube 232e, the mass flow controller 241e and the valve 243e.

A mass flow controller (MFC) 241b which is a flow rate controller (flow rate control section) and a valve 243b which is an on-off valve are installed in the second gas supply tube 232b sequentially from the upstream direction. Further, a second inert gas supply tube 232f is connected to a downstream side with reference to the valve 243b of the second gas supply tube 232b. A mass flow controller 241f which is a flow rate controller (flow rate control section) and a valve 243f which is an on-off valve are installed in the second inert gas supply tube 232f sequentially from the upstream direction. Further, the above-mentioned second nozzle 249b is connected to a tip end part of the second gas supply tube 232b. The second nozzle 249b is installed to stand up in a loading direction of the wafer 200, along an upper part from a lower part of the reaction tube 203 on an inner wall, in an arc-shaped space between the inner wall of the reaction tube 203 and the wafer 200. That is, the second nozzle 249b is installed beside a wafer arrangement area where the wafers 200 are arranged, in an area that horizontally surrounds the wafer arrangement area, along the wafer arrangement area. The second nozzle 249b is configured as an L shaped long nozzle, has a horizontal part installed to go through a lower side wall of the reaction tube 203 and a vertical part installed to rise at least from one end side to the other end side of the wafer arrangement area. A gas supply port 250b for gas supply is formed in a side surface of the second nozzle 249b. The gas supply port 250b is opened to direct toward the center of the reaction tube 203. Plural gas supply ports 250b are installed over the upper part from the lower part of the reaction tube 203, have the same aperture area, and are installed with the same aperture pitch. Mainly, a second gas supply system is configured by the second gas supply tube 232b, the mass flow controller 241b, the valve 243b and the second nozzle 249b. Further, a second inert gas supply system is mainly configured by the second inert gas supply tube 232f, the mass flow controller 241f and the valve 243f.

A mass flow controller (MFC) 241c which is a flow rate controller (flow rate control section) and a valve 243c which is an on-off valve are installed in the third gas supply tube 232c sequentially from the upstream direction. Further, a third inert gas supply tube 232g is connected to a downstream side with reference to the valve 243c of the third gas supply tube 232c. A mass flow controller 241g which is a flow rate controller (flow rate control section) and a valve 243g which is an on-off valve are installed in the third inert gas supply tube 232g sequentially from the upstream direction. Further, the above-mentioned first nozzle 249c is connected to a tip end part of the third gas supply tube 232c. The third nozzle 249c is installed to stand up in a loading direction of the wafer 200, along an upper part from a lower part of the reaction tube 203 on an inner wall, in an arc-shaped space between the inner wall of the reaction tube 203 and the wafer 200. That is, the third nozzle 249c is installed beside a wafer arrangement area where the wafers 200 are arranged, in an area that horizontally surrounds the wafer arrangement area, along the wafer arrangement area. The third nozzle 249c is configured as an L shaped long nozzle, has a horizontal part installed to go through a lower side wall of the reaction tube 203 and a vertical part installed to rise at least from one end side to the other end side of the wafer arrangement area. A gas supply port 250c for gas supply is formed in a side surface of the first nozzle 249c. The gas supply port 250c is opened to direct toward the center of the reaction tube 203. Plural gas supply ports 250c are installed over the upper part from the lower part of the reaction tube 203, have the same aperture area, and are installed with the same aperture pitch. Mainly, a third gas supply system is configured by the third gas supply tube 232c, the mass flow controller 241c, the valve 243c and the third nozzle 249c. Further, a third inert gas supply system is mainly configured by the third inert gas supply tube 232g, the mass flow controller 241g and the valve 243g.

A mass flow controller (MFC) 241d which is a flow rate controller (flow rate control section) and a valve 243d which is an on-off valve are installed in the fourth gas supply tube 232d sequentially from the upstream direction. Further, a fourth inert gas supply tube 232h is connected to a downstream side with reference to the valve 243d of the fourth gas supply tube 232d. A mass flow controller 241h which is a flow rate controller (flow rate control section) and a valve 243h which is an on-off valve are installed in the fourth inert gas supply tube 232h sequentially from the upstream direction. Further, the above-mentioned fourth nozzle 249d is connected to a tip end part of the fourth gas supply tube 232d. The fourth nozzle 249d is installed to stand up in a loading direction of the wafer 200, along an upper part from a lower part of the reaction tube 203 on an inner wall, in an arc-shaped space between the inner wall of the reaction tube 203 and the wafer 200. That is, the fourth nozzle 249d is installed beside a wafer arrangement area where the wafers 200 are arranged, in an area that horizontally surrounds the wafer arrangement area, along the wafer arrangement area. The fourth nozzle 249d is configured as an L shaped long nozzle, has a horizontal part installed to go through a lower side wall of the reaction tube 203 and a vertical part installed to rise at least from one end side to the other end side of the wafer arrangement area. A gas supply port 250d for gas supply is formed in a side surface of the fourth nozzle 249d. The gas supply port 250d is opened to direct toward the center of the reaction tube 203. Plural gas supply ports 250d are installed over the upper part from the lower part of the reaction tube 203, have the same aperture area, and are installed with the same aperture pitch. Mainly, a fourth gas supply system is configured by the fourth gas supply tube 232d, the mass flow controller 241d, the valve 243d and the fourth nozzle 249d. Further, a fourth inert gas supply system is mainly configured by the fourth inert gas supply tube 232h, the mass flow controller 241h and the valve 243h.

In this way, in a gas supply method according to the present exemplary embodiment, gases are transported through the nozzles 249a, 249b, 249c and 249d disposed in the arc-shaped vertical space defined by the inner wall of the reaction tube 203 and the edge parts of the plural wafers 200 which are loaded, and are initially ejected into the reaction tube 203 in the vicinity of the wafers 200 from the gas supply ports 250a, 250b, 250c and 250d that are respectively opened in the nozzles 249a, 249b, 249c and 249d. Here, a main flow of the gases in the reaction tube 203 is adjusted in a direction that is parallel to the front surface of the wafer 200, that is, in the horizontal direction. With such a configuration, it is possible to uniformly supply the gases to each wafer 200, and to make uniform the thickness of a thin film formed on each wafer 200. A residual gas after reaction flows toward an exhaust port, that is, the exhaust pipe 231 (which will be described later), but the flow direction of the residual gas is suitably specified according to the position of the exhaust port, and is not limited to the vertical direction.

An organosilicon-based gas that is a source gas is supplied into the processing chamber 201 from the first gas supply tube 232a through the mass flow controller 241a, the valve 243a and the first nozzle 249a.

A hydrogen-containing gas that is a reducing gas is supplied into the processing chamber 201 from the second gas supply tube 232b through the mass flow controller 241b, the valve 243b and the second nozzle 249b.

An oxygen-containing gas that is an oxidation gas is supplied into the processing chamber 201 from the third gas supply tube 232c through the mass flow controller 241c, the valve 243c and the third nozzle 249c.

A nitrogen-containing gas that is a nitride gas is supplied into the processing chamber 201 from the fourth gas supply tube 232d through the mass flow controller 241d, the valve 243d and the fourth nozzle 249d.

For example, nitrogen ($N_2$) gas is supplied into the processing chamber 201 through the mass flow controllers 241e, 241f, 241g and 241h, the valves 243e, 243f, 243g and the 243h, the gas supply tubes 232a, 232b, 232c and 232d, and the gas nozzles 249a, 249b, 249c and 249d, respectively, from the inert gas supply tubes 232e, 232f, 232g and 232h.

Here, for example, when the above-described gases flow through the respective gas supply tubes, an organosilicon-based gas supply system is configured by the first gas supply system. Further, a hydrogen-containing gas supply system is configured by a second gas supply system. Further, an oxygen-containing gas supply system is configured by a third gas supply system. Further, a nitrogen-containing gas supply system is configured by a fourth gas supply system.

The exhaust pipe 231 that exhausts an atmosphere in the processing chamber 201 is installed in the reaction tube 203. As shown in FIG. 2, in a cross-section, the exhaust pipe 231 is installed on the side opposite to the side where the gas supply ports 250a of the first nozzle 249a in the reaction tube 203, the gas supply ports 250b of the second nozzle 249b, the gas supply ports 250c of the third nozzle 249c and the gas supply ports 250d of the fourth nozzle 249d are formed, that is, on the side opposite to the gas supply ports 250a, 250b, 250c and 250d with the wafers 200 being interposed therebetween. Further, as shown in FIG. 1, in a longitudinal section, the exhaust pipe 231 is installed in a lower part with reference to portions where the gas supply ports 250a, 250b, 250c and 250d are installed. With such a configuration, the gases supplied in the vicinity of the wafers 200 in the processing chamber 201 from the gas supply ports 250a, 250b, 250c and 250d flow in the horizontal direction, that is, in the direction parallel to the front surface of the wafer 200, flow downward, and are exhausted through the exhaust pipe 231. The main flow of the gases in the processing chamber 201 becomes a flow flowing in the horizontal direction as described above. A vacuum pump 246 which is a vacuum exhaust device is connected to the exhaust pipe 231 through a pressure sensor 245 which is a pressure detector (pressure detecting section) that detects the pressure in the processing chamber 201 and an APC (Auto Pressure Controller) valve 244 which is a pressure adjustor (pressure adjusting section). As the APC valve 244 opens and closes the valve in a state in which the vacuum pump 246 is operated, it is possible to perform vacuum exhaust and vacuum exhaust stop in the processing chamber 201. Further, as the opening level is adjusted in a state in which the vacuum pump 246 is operated, it is possible to adjust the pressure in the processing chamber 201. Mainly, the exhaust system is configured by the exhaust pipe 231, the APC valve 244 and the pressure sensor 245. The vacuum pump 246 may be considered to be included in the exhaust system. As the exhaust system adjusts the opening level of the valve of the APC valve 244 on the basis of pressure information detected by the pressure sensor 245 while operating the vacuum pump 246, it is possible to perform vacuum exhaust so that the pressure in the processing chamber 201 becomes a predetermined pressure (vacuum level).

A seal cap 219 that is a furnace port cover capable of air-tightly blocking a lower end aperture of the reaction tube 203 is installed in a lower part of the reaction tube 203. The seal cap 219 is in contact with the lower end of the reaction tube 203 from the lower side in the vertical direction. The seal cap 219 is made of metal such as stainless steel, for example, and is formed in a disk-shape. An O ring 220 which is a seal member that is in contact with the lower end of the reaction tube 203 is installed on an upper surface of the seal cap 219. A rotation mechanism 267 that rotates a boat is installed on the side of the seal cap 219 that is opposite to the processing chamber 201. A rotation shaft 255 of the rotation mechanism 267 goes through the seal cap 219 to be connected to a boat 217 (which will be described later), and rotates the boat 217 to rotate the wafer 200. The seal cap 219 moves up and down in the vertical direction by a boat elevator 115 that is an elevating mechanism which is vertically installed outside the reaction tube 203, and thus, it is possible to transport the boat 217 into or out of the processing chamber 201.

The boat 217 that is a substrate support tool is formed of a heat-resistant material such as quartz or silicon carbide, for example, and supports the plural wafers 200 at multi stages in a state in which the plural wafers 200 are aligned in the horizontal posture and in the state of being centered. A heat insulating member 218 made of a heat-resistance material such as quartz or silicon carbide is disposed under the boat 217, and thus, heat from the heater 207 is hardly transported to the side of the seal cap 219. The heat insulating member 218 may include plural sheets of heat insulating plates made of a heat-resistant material such as quartz or silicon carbide, and a heat insulating plate holder that supports the plural heat insulating plates in the horizontal posture at multi stages.

A temperature sensor 263 that is a temperature detector is installed in the reaction tube 203, and an electrification condition to the heater 207 is adjusted on the basis of the temperature information detected by the temperature sensor 263 so that a temperature in the processing chamber 201 becomes a desired temperature distribution. The temperature sensor 263 is formed in an L-shape in a similar way to the nozzles 249a, 249b, 249c and 249d, and is installed along the inner wall of the reaction tube 203.

Figure 3:
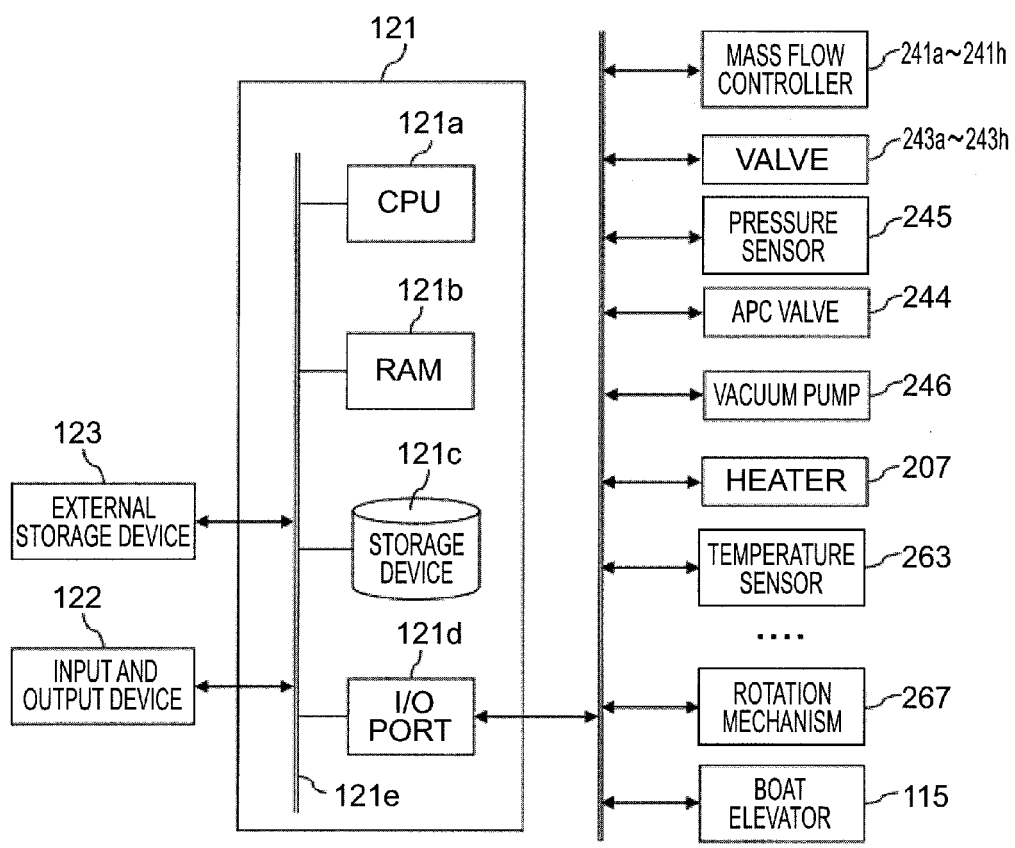
FIG. 3 is a diagram illustrating a schematic configuration of a controller of a substrate processing apparatus which is preferably used in an exemplary embodiment of the present invention.

As shown in FIG. 3, a controller 121 that is a control section (control means) is configured as a computer that includes a CPU (Central Processing Unit) 121a, a RAM (Random Access Memory) 121b, a storage device 121c, and an I/O port 121d. The RAM 121b, the storage device 121c and the I/O port 121d are configured to be able to perform data exchange with the CPU 121a through an internal bus 121e. An input and output device 122 that is configured as a touch panel or the like, for example, is connected to the controller 121.

The storage device 121c includes a flash memory, an HDD (Hard Disk Drive) or the like, for example. A control program that controls an operation of the substrate processing apparatus, a process recipe in which an operation, condition or the like of substrate processing (which will be described later) is written, or the like is stored to be readable in the storage device 121c. The process recipe functions as a program that is combined to allow the controller 121 to execute each operation in the substrate processing processes (which will be described later) to obtain a predetermined result. Hereinafter, the process recipe, the control program or the like may be simply referred to as a program. A case in which the term "program" is used in the present specification may include a case in which only the process recipe is included, a case in which only the control program is included, or a case in which the process recipe and the control program are all included. Further, the RAM 121b is configured as a memory region (work area) in which the program, data or the like read by the CPU 121a is temporarily retained.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the rotation mechanism 267, the boat elevator 115 and the like, as mentioned above.

The CPU 121a reads the control program from the storage device 121c to be executed and reads the process recipe from the storage device 121c according to input or the like of an operation command from the input and output device 122. Further, the CPU 121a is configured to control the flow rate adjustment operations of various gases through the mass flow controllers 241a, 241b, 241c, 241d, 241e, 241f, 241g and 241h, the on-off operations of the valves 243a, 243b, 243c, 243d, 243e, 243f, 243g and 243h, the pressure adjustment operation through the APC valve 244 based on the on-off operation of the APC valve 244 and the pressure sensor 245, the temperature adjustment operation of the heater 207 based on the temperature sensor 263, and the start-up and stop of the vacuum pump 246, the rotation and rotation rate adjustment operation of the boat 217 through the rotation mechanism 267, the elevating operation of the boat 217 through the boat elevator 115, and the like, according to content of the read program recipe.

The controller 121 is not limited to a configuration as a dedicated purpose computer, and may be configured as a general purpose computer. For example, by preparing an external storage device (for example, a magnetic tape, a magnetic disk such as a flexible disk or a hard disk, an optical disc such as a CD or DVD, a magneto-optical disc such as an MO, a semiconductor memory such as a USB memory or a memory card) 123 that stores the above-mentioned program and by installing the program in the general purpose computer using the external storage device 123, it is possible to configure the controller 121 according to the present exemplary embodiment. Means for supplying the program in the computer is not limited to the supply through the external storage device 123. For example, the program may be supplied using communication means such as the Internet or a dedicated line, without going through the external storage device 123. The storage device 121c or the external storage device 123 is configured as a computer-readable storage medium. Hereinafter, the storage device 121c and the external storage device 123 are simply referred to as a non-transitory computer-readable recording medium. A case in which the term "non-transitory computer-readable recording medium" is used in the present specification may include a case in which only the storage device 121c is included, a case in which only the external storage device 123 is included, or a case in which the storage device 121c and the external storage device 123 are all included.

A method of supplying the organosilicon-based gas and the hydrogen-containing gas into the processing chamber 201 to form a film (SiC-based film) that includes silicon and carbon on the wafer 200 that is a substrate using the substrate processing apparatus will be described. In the present exemplary embodiment, an example in which the silicon carbide film (SiC film) is formed as a film that includes silicon and carbon using 1,4-disilabutane ($Si_2C_2H_{10}$, simply referred to as DSB) gas as the organosilicon-based gas and using hydrogen ($H_2$) gas as the hydrogen-containing gas, under the state without using plasma will be described. The organosilicon-based gas acts as a silicon source and as a carbon source when the SiC film is formed. The DSB used as an organosilicon-based source in the present exemplary embodiment is a kind of organosilane, that is, organosilane compound, and may be referred to as a source that includes only three elements of silicon element, carbon element and hydrogen element. The DSB may be referred to as an organosilicon-based source, or may be referred to as an organosilane source or organosilane compound source. In the present exemplary embodiment, formation of the film (SiC-based film) that includes the silicon and carbon using the semiconductor silicon wafer as the wafer 200 is performed as one process of a manufacturing method of a semiconductor device. The SiC-based film such as SiC is an insulation film having high resistances against etching and oxidation, and may be preferably used for a transistor gate periphery or a wiring structure.

If the plural wafers 200 are loaded in the boat 217 (wafer charging), as shown in FIG. 1, the boat 217 that supports the plural wafers 200 is raised by the boat elevator 115 to be transported into the processing chamber 201 (boat loading), and the plural wafers 200 are accommodated in the processing chamber 201. In this state, the seal cap 219 is in a state in which the lower end of the reaction tube 203 is sealed through the O ring 220.

Next, in a state in which the vacuum pump 246 is operated, the APC valve 244 is fully opened in a gradual manner to vacuum-exhaust the inside of the processing chamber 201 by the vacuum pump 246, and thus, the base pressure (vacuum level) in the processing chamber 201 is set to 1 Pa or lower. The vacuum pump 246 maintains a state in which the vacuum pump 246 is normally operated at least until the process with respect to the wafer 200 ends. By rotating the boat 217 by the rotation mechanism 267, the wafer 200 rotates (wafer rotation), preferably, the number of revolutions is uniformly maintained in the range of 1 rpm to 10 rpm, for example. Rotation of the boat 217 and the wafer 200 through the rotation mechanism 267 is continuously performed at least until the process with respect to the wafer 200 is completed. By heating the inside of the processing chamber 201 by the heater 207, the temperature in the processing chamber 201 is set to a desired temperature, and thus, the temperature of the wafer 200 is preferably maintained at a desired temperature in the range of 350° C. to 500° C., for example. Here, the power supply level to the heater 207 is feedback-controlled on the basis of the temperature information detected by the temperature sensor 263 so that the inside of the processing chamber 201 reaches a desired temperature distribution (temperature adjustment). Heating the inside of the processing chamber 201 through the heater 207 is continuously performed at least until the process with respect to the wafer 200 is completed.

Thereafter, preferably, nitrogen ($N_2$) gas of several liters per minute is supplied into the processing chamber 201 through the mass flow controllers 241e and 241f, the valves 243e and 243f, the gas supply tube 232a and 232b and the gas nozzles 249a and 249b from the inert gas supply tubes 232e and 232f to perform nitrogen purge for several minutes at an arbitrary pressure, and then, the nitrogen gas supply is stopped to end the nitrogen purge.

Then, in a state in which the APC valve 244 is fully opened, the inside of the processing chamber 201 is vacuum-exhausted by the vacuum pump 246 to preferably set the base pressure in the processing chamber 201 to 1 Pa or lower, for example. As the pressure in the processing chamber 201 is set to 1 Pa or lower, the APC valve 244 is fully closed to start a confined state. Here, the APC valve 244 may be slightly opened without being completely closed.

The temperature of the wafer 200 is preferably maintained at the desired temperature in the range of 350° C. to 500° C., for example, and the rotation of the wafer 200 is preferably maintained at the desired number of revolutions in the range of 1 rpm to 10 rpm, for example. In a state in which the APC valve 244 is completely closed, the DSB gas that is the organosilicon-based gas is introduced to the processing chamber 201 through the mass flow controller 241a, the valve 243a and the first nozzle 249a from the first gas supply tube 232a. At the same time, $H_2$ gas that is the hydrogen-containing gas is introduced to the processing chamber 201 through the mass flow controller 241b, the valve 243b and the second nozzle 249b from the second gas supply tube 232b. The DSB gas and the $H_2$ gas are confined in the processing chamber 201 due to these operations (process A). The $H_2$ gas is preferably introduced with a desired flow rate in the range of 0.1 slm to 5 slm, for example, and the DSB gas is preferably introduced with a desired flow rate in the range of 0.1 slm to 1 slm, for example. The supply time of the $H_2$ gas is preferably set to a desired time in the range of 1 second to 60 seconds, for example, and the supply time of the DSB gas is preferably set to a desired time in the range of 1 second to 60 seconds, for example. Further, the DSB gas and the $H_2$ gas are preferably confined in the processing chamber 201 with a desired pressure in the range of 200 Pa to 5000 Pa, for example.

Then, in a state in which the supply to the processing chamber 201 of the DSB gas and the $H_2$ gas is stopped and the APC valve 244 is completely closed, the confined state of the DSB gas and the $H_2$ gas in the processing chamber 201 is maintained (process B). The time when the supply of the DSB gas and the $H_2$ gas is stopped, that is, the time when the confined state of the DSB gas and the $H_2$ gas in the processing chamber 201 is maintained is preferably set to a desired time in the range of 1 minute to 90 minutes, for example.

In process A or in process A and process B, the APC valve 244 may be slightly opened without completely closing the APC valve 244, so that the respective gases may be slightly exhausted to slightly form the gas flow. Here, the supply to the processing chamber 201 of the DSB gas and the $H_2$ gas may be continued without completely being stopped. In this case, for example, in process A or in process A and process B, the respective gases are exhausted from the processing chamber 201 while being supplied into the processing chamber 201, and at this time, a state in which the exhaust rate of the respective gases from the processing chamber 201 is lower than the supply rate of the respective gases into the processing chamber 201 may be maintained so that the respective gases are slightly exhausted. That is, in process A or in process A and process B, by maintaining a state in which the total gas exhaust rate from the processing chamber 201 (total gas exhaust amount per unit time at a predetermined pressure, that is, exhaust flow rate (volume flow rate)) is lower than the total gas supply rate into the processing chamber 201 (total gas supply amount per unit time at a predetermined pressure, that is, supply flow rate (volume flow rate)), the respective gases may be slightly exhausted. In this case, in process A, the respective gases are exhausted from the processing chamber 201 while being supplied into the processing chamber 201 to form a state in which the exhaust rate of the respective gases from the processing chamber 201 is lower than the supply rate of the respective gases into the processing chamber 201, and in process B, the state is maintained.

Even though the respective gases are slightly exhausted in this way or the gases are slightly exhausted while being supplied, it is possible to form a confined state that is substantially the same as in the case in which the APC valve 244 is completely closed. Accordingly, a state in which the respective gases are slightly exhausted in this way in the present specification or a state in which the gases are slightly exhausted while being supplied may be considered to be included in the confined state. That is, a case in which the term "confine" is used in the present specification includes a case in which the exhaust of the inside of the processing chamber 201 is stopped by completely closing the APC valve 244, and also includes a case in which the APC valve 244 is slightly opened without being completely closed to maintain the state in which the exhaust rate of the gases supplied into the processing chamber 201 is lower than the supply rate of the respective gases supplied into the processing chamber 201 so that the respective gases are slightly exhausted.

Further, in a procedure where process A and process B are performed, SiC is grown on the wafer 200, and thus, the SiC film is formed on the wafer 200. Further, after process A and process B are performed a predetermined number of times, the APC valve 244 is fully opened to rapidly exhaust the inside of the processing chamber 201 (process C).

Figure 4:
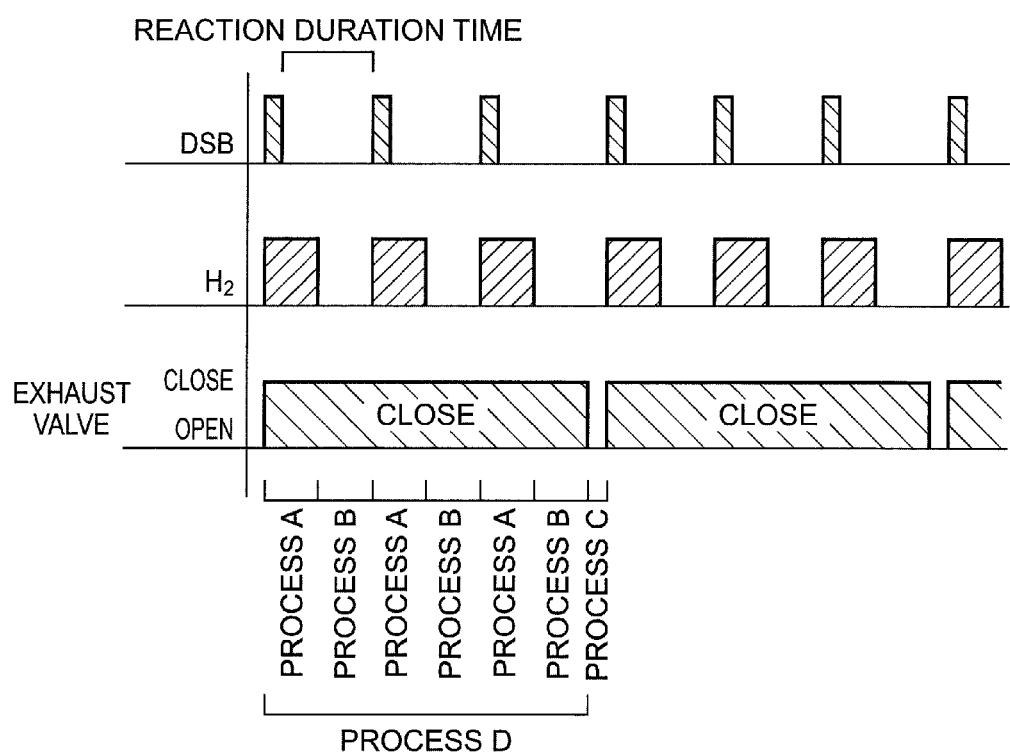
FIG. 4 is a diagram illustrating a film forming sequence of an exemplary embodiment of the present invention.

A cycle that includes process A, process B and process C, that is, a cycle that includes a process (process D) in which process A and process B are performed a predetermined number of times and process C is performed a predetermined number of times until the film thickness of the SiC film formed on the wafer 200 becomes a desired film thickness. The SiC film of the desired film thickness may be formed by performing the cycle once, or by performing the cycle plural times. In a case in which the desired film thickness is relatively thick, it is preferable to repeat the cycle plural times. In this case, a relatively thin SiC film may be formed per cycle, and the thin SiC films may be then layered to thereby form the SiC film having the desired film thickness. Accordingly, in a case in which the relatively thick SiC film is formed, it is possible to achieve excellent step coverage characteristics. An example of the cycle and sequence according to the present exemplary embodiment is shown in FIG. 4. FIG. 4 shows an example of repeating, a plurality of number of times, the cycle that includes the process (process D) in which process A and process B are performed three times, and the process C.

Thereafter, preferably, nitrogen ($N_2$) gas of several liters per minute, for example, is supplied into the processing chamber 201 through the mass flow controllers 241e and 241f, the valves 243e and 243f, the gas supply tube 232a and 232b and the gas nozzles 249a and 249b from the inert gas supply tubes 232e and 232f to preferably perform nitrogen purge for several minutes, for example, at an arbitrary pressure, and then, the nitrogen gas supply is stopped to end the nitrogen purge.

Then, the rotation of the boat 217 through the rotation mechanism 267 is stopped to close the APC valve 244, and the nitrogen ($N_2$) gas of several liters per minute is preferably supplied to the processing chamber 201, for example, through the mass flow controllers 241e and 241f, the valves 243e and 243f, the gas supply tube 232a and 232b and the gas nozzles 249a and 249b, from the inert gas supply tubes 232e and 232f until the pressure in the processing chamber 201 reaches atmospheric pressure (return to atmospheric pressure).

The boat 217 that supports the wafers 200 on which the film formation is completed is transported out of the processing chamber 201 by the boat elevator 115 (boat unloading). Then, the plural wafers 200 after the film formation process are extracted from the boat 217.

In the above-described present exemplary embodiment, as shown in FIG. 4, a process of alternately repeating the process of supplying the DSB gas and the $H_2$ gas into the processing chamber 201 to be confined (process A) and the process of maintaining the state in which the DSB gas and the $H_2$ gas are confined in the processing chamber 201 (process B) plural times (for example, three times) (process D), and the process of exhausting the inside of the processing chamber 201 (process C) are alternately repeated plural times. That is, in the present exemplary embodiment, the cycle that includes process D of performing the cycle that includes process A and process B over plural cycles (for example, three cycles) and process C is repeated over plural cycles.

In the present exemplary embodiment, whenever the cycle that includes process A and process B is performed by three cycles, process C is performed once, but whenever the cycle that includes process A and process B is performed once, process C may be performed. That is, the process of alternately performing process A and process B once and the process C may be alternately repeated plural times. In this case, the cycle that includes process A, process B and process C is repeated plural times.

Further, whenever the cycle that includes process A and process B is performed once, process C may be performed, and the one-time supply amount of the DSB gas and the $H_2$ gas in process A may be larger than the one-time supply amount of the DSB gas and the $H_2$ gas according to the present exemplary embodiment (for example, the supply amount of three times the one-time supply amount of the DSB gas and the $H_2$ gas in process A in the present exemplary embodiment, which is the same as the supply amount when the cycle that includes process A and process B is performed over three cycles). Here, in this case, since a large amount of gas is supplied by one-time supply, the film forming rate is increased, but the pressure in the processing chamber 201 is rapidly increased, and thus, wafer in-plane film thickness uniformity or step coverage may be deteriorated.

On the other hand, whenever the cycle that includes process A and process B is performed once, process C is performed, and if the one-time supply amount of the DSB gas and the $H_2$ gas in process A is decreased (for example, the supply amount which is the same as or less than the one-time supply amount of the DSB gas and the $H_2$ gas in process A in the present exemplary embodiment), the wafer in-plane film thickness uniformity or step coverage is improved, but the film forming rate becomes slow.

In the present exemplary embodiment, whenever the cycle that includes process A and process B is performed by three cycles, process C is performed once. That is, in a state in which the APC valve 244 is completely closed, the DSB gas and the $H_2$ gas are respectively supplied plural times (three times), and the pressure in the processing chamber 201 is gradually increased at multi stages (here, 3 stages). At the first stage (first cycle), the pressure is the lowest among three stages and the film formation rate is the lowest, but the wafer in-plane film thickness uniformity or step coverage may be the most satisfactory. On the other hand, at the third stage (third cycle), the pressure is the highest among three stages and the film formation rate is the highest, but the wafer in-plane film thickness uniformity or step coverage may be deteriorated. The second stage (second cycle) has intermediate characteristics between the first stage (first cycle) and the third stage (third cycle).

Here, as in the present exemplary embodiment, in a case in which the pressure is increased at multi stages such as three stages, since a film having satisfactory wafer in-plane film thickness uniformity or satisfactory step coverage is formed at the first stage (first cycle), a film is formed using the film having satisfactory wafer in-plane film thickness uniformity or step coverage as a base at the second stage, the third stage or the like. Here, due to the influence of the base, a film having satisfactory wafer in-plane film thickness uniformity or satisfactory step coverage is formed thereafter. In this way, in a case in which the pressure is increased at multi stages, it is possible to form an initial layer having satisfactory wafer in-plane film thickness uniformity or satisfactory step coverage in an initial stage, and then, it is possible to increase the film formation rate while maintaining wafer in-plane film thickness uniformity or satisfactory step coverage.

In the present exemplary embodiment, as shown in FIG. 4, the supply time of the $H_2$ gas is longer than the supply time of the DSB gas, but the supply time of the $H_2$ gas and the supply time of the DSB gas may be the same, or the supply time of the $H_2$ gas may be shorter than the supply time of the DSB gas. Here, it is preferable that the supply time of the $H_2$ gas be the same as the supply time of the DSB gas.

In the present exemplary embodiment, in process A of supplying the DSB gas and the $H_2$ gas into the processing chamber 201 to be confined, due to the supply of the DSB gas into the heated processing chamber 201, the DSB gas is thermally decomposed in the processing chamber 201. That is, a thermal decomposition reaction of the DSB gas occurs in a gas phase or on a surface of an object. In process B as well as process A, the thermal decomposition reaction of the DSB gas supplied into the processing chamber 201 similarly occurs. At this time, a part of the $H_2$ gas supplied into the processing chamber 201 together with the DSB gas is also thermally decomposed to slightly generate atomic hydrogen (H). Thus, the atomic hydrogen is slightly included in the gas phase.

Withdrawal of hydrogen (H) or dissociation of the C—C bond in the DSB gas occurs due to the thermal decomposition reaction of the DSB gas in the gas phase. However, before the DSB gas having a dangling bond generated as described above is chemically adsorbed on the front surface of the wafer 200, the atomic hydrogen that is slightly included in the gas phase is combined with the DSB gas having the above-mentioned dangling bond, which may be considered as a thermal equilibrium state in the gas phase, thereby resulting in suppression of the thermal decomposition reaction of the DSB gas. As a result, physical adsorption of the DSB gas to the front surface of the wafer 200 and thermal decomposition reaction of the DSB gas that is physically adsorbed to the front surface of the wafer 200 are dominant. That is, a reaction in which the DSB gas that is physically adsorbed to the front surface of the wafer 200 to be thermally decomposed to have the dangling bond is combined with a bond of a material that forms a base to form the SiC is dominant. Here, a similar reaction slightly occurs in the DSB gas in the gas phase, but the reaction on the front surface of the wafer 200 is dominant.

The above-mentioned operation provides support so that H$_2$ gas supports the DSB gas to uniformly move to the bottom of a concavity such as a trench or via formed on the front surface of the wafer 200, which causes the reaction on the front surface of the wafer 200 to be able to uniformly occur with respect to the concavity such as a trench or via. Further, the atomic hydrogen that is slightly included in the gas phase acts so that the outermost surface of the wafer 200 is constantly in a hydrogen terminal state, and due to the action, the DSB gas easily migrates on the front surface of the wafer 200. Thus, it is possible to form an SiC film having excellent flatness or high step coverage.

According to the technique of the present exemplary embodiment, for example, it is possible to form an SiC film having a step coverage of 80% to 95% with respect to the wafer 200 having a concavity such as a trench or via having a high aspect ratio of 5 or higher.

In order to thermally decompose the DSB gas, in process A of supplying the DSB gas and the H$_2$ gas into the processing chamber 201 to be confined, the pressure in the processing chamber 201 is set to a pressure in the range of 200 Pa to 5000 Pa, preferably, due to the supply of the DSB gas and the H$_2$ gas into the processing chamber 201. Further, the temperature of the heater 207 is preferably set to a temperature at which the temperature of the wafer 200 becomes a temperature in the range of 350° C. to 500° C. The N$_2$ gas that is an inert gas may be supplied from the inert gas supply tubes 232e and 232f into the processing chamber 201. Further, a rare gas such as Ar gas, He gas, Ne gas or Xe gas, instead of the N$_2$ gas, may be used as the inert gas.

If the temperature of the wafer 200 is lower than 350° C., the DSB gas or the H$_2$ gas is hardly thermally decomposed, and the above-mentioned reaction hardly occurs, and thus, the SiC film is not formed. If the temperature of the wafer 200 exceeds 500° C., the gas phase reaction excessively occurs, and thus, it is difficult to secure wafer in-plane film thickness uniformity. Accordingly, it is preferable that the temperature of the wafer 200 be in the range of 350° C. to 500° C.

Further, if the pressure in the processing chamber 201 is lower than 200 Pa, the above-mentioned reaction due to the DSB gas or H$_2$ gas hardly occurs. If the pressure in the processing chamber 201 exceeds 5000 Pa, it takes time to exhaust the inside of the processing chamber 201 in process C, which affects a throughput. Further, the gas phase reaction excessively occurs, and thus, it is difficult to secure wafer in-plane film thickness uniformity. Accordingly, it is preferable that the pressure in the processing chamber 201 be in the range of 200 Pa to 5000 Pa.

In the processing chamber 201 under such a state (condition), if the supply flow rate of the DSB gas is lower than 100 sccm, the film forming rate is extremely deteriorated. Further, if the supply flow rate of the DSB gas exceeds 1000 sccm, the film thickness uniformity is extremely decreased. Accordingly, it is preferable that the supply flow rate of the DSB gas be in the range of 100 to 1000 sccm (0.1 slm to 1 slm).

Further, it is difficult to set the supply time of the DSB gas to be shorter than 1 second in view of valve control. It is preferable that the supply time of the DSB gas be set to be as short as possible and the reaction duration time (time when the supply of DSB gas is stopped) be set to be as long as possible. That is, it is preferable to supply an appropriate amount of DSB gas in a short time. Accordingly, it is preferable to set the supply time of the DSB gas to a time in the range of 1 to 60 seconds.

Further, in the processing chamber 201 under such a state (condition), if the supply flow rate of the H$_2$ gas is lower than 100 sccm, the amount of the atomic hydrogen that is slightly included in the gas phase is extremely decreased. Thus, the supply of the atomic hydrogen to the DSB gas that has the dangling bond due to withdrawal of hydrogen or dissociation of C—C combination is not sufficiently performed, and thus, combination of the atomic hydrogen and the DSB gas that has the dangling bond hardly occurs. Further, if the supply flow rate of the H$_2$ gas exceeds 5000 sccm, the amount of the atomic hydrogen that does not contribute to the supply of the atomic hydrogen to the DSB gas that has the dangling bond and the combination of the atomic hydrogen and the DSB gas that has the dangling bond is increased, which is useless. Accordingly, it is preferable that the supply flow rate of the H$_2$ gas be a flow rate in the range of 100 to 5000 sccm (0.1 to 5 slm).

Further, it is difficult to set the supply time of the H$_2$ gas to be shorter than 1 second in view of valve control. It is preferable that the supply time of the H$_2$ gas be set to be as short as possible and the reaction duration time be set to be as long as possible. That is, it is preferable to supply an appropriate amount of H$_2$ gas in a short time. Accordingly, it is preferable to set the supply time of the H$_2$ gas to a time in the range of 1 to 60 seconds.

In process B of stopping the supply of the DSB gas and the H$_2$ gas into the processing chamber 201 and maintaining the state in which the DSB gas and the H$_2$ gas are confined in the processing chamber 201, the reaction which occurs in process A is continued. By continuing the reaction, the SiC film grows on the wafer 200.

Since the DSB gas and the H$_2$ gas do not easily react with each other and the reaction rate is considerably slow (it takes time for reaction), the state in which the DSB gas and the H$_2$ gas are confined in the processing chamber 201 is maintained to secure time for reaction. Thus, it is possible to sufficiently perform the reaction to form the SiC film.

Here, the pressure in the processing chamber 201 maintains a pressure in the range of 200 to 5000 Pa, preferably. Further, preferably, the temperature of the heater 207 is set to a temperature at which the temperature of the wafer 200 becomes a temperature in the range of 350° C. to 500° C. That is, the pressure in the pressure range and the temperature in the temperature range that are the same as in process A are maintained.

The time when the supply of the DSB gas is stopped is preferably set to a time in the range of 1 minute to 90 minutes, for example. If the time when the supply of DSB gas is stopped is set to be shorter than 1 minute, the above-mentioned reaction is not sufficient. If the reaction is performed to some extent, the amount of the DSB gas or the atomic hydrogen is decreased, and thus, although the reaction occurs, the reaction efficiency is reduced. Even though this state is continued, the film formation in a state in which the film forming rate is decreased is continued. That is, if the time when the supply of DSB gas is stopped is excessively long, it affects the throughput. Accordingly, it is preferable that the time when the supply of DSB gas is stopped be set to a time in the range of 1 minute to 90 minutes.

It is confirmed that the cycle rate (film forming rate per cycle (cycle that includes process A and process B)) of the SiC film formed according to the present exemplary embodiment is 0.01 to 1 nm/cycle, and it is possible to obtain an arbitrary film thickness by controlling the number of cycles. For example, as the film thickness of the SiC film in a case in which the SiC film is applied to an etching stopper, 100 to 500 Å (10 to 50 nm) is used, and in this case, by repeating the cycle over 10 to 5000 cycles, for example, it is possible to realize the film thickness.

In the present exemplary embodiment, since the DSB gas and the $H_2$ gas are supplied into the processing chamber 201 to be confined, even in a case where the DSB gas and the $H_2$ gas that are gases that hardly react with each other in a low temperature region are used, it is possible to enhance the reaction efficiency, and to enhance the film forming efficiency (consumption of the DSB gas and the $H_2$ gas, film forming rate and the like).

Further, in this method, by controlling the time when the state in which the DSB gas and the $H_2$ gas are confined in the processing chamber 201 is maintained, the atomic concentration of carbon (C) in the SiC film may be controlled to be 25% to 35%, for example. That is, by controlling the time when the supply of the DSB gas and the $H_2$ gas is stopped, particularly, the time when the supply of DSB gas is stopped, it is possible to control the atomic concentration of carbon (C) in the SiC film. Further, by controlling the supply amount of the DSB gas and the $H_2$ gas or the temperature of the wafer 200, it is possible to control the atomic concentration of carbon (C) in the SiC film. In the film formation through the thermal process in the low temperature region as in the present exemplary embodiment, it is confirmed that the carbon concentration in the SiC film is limited to 35% and the concentration exceeding 35% cannot be realized. By controlling the carbon concentration in the SiC film and increasing the carbon concentration in the SiC film, it is possible to reduce a relative dielectric constant (k value) of the SiC film, and to enhance etching resistance.

Figure 5:
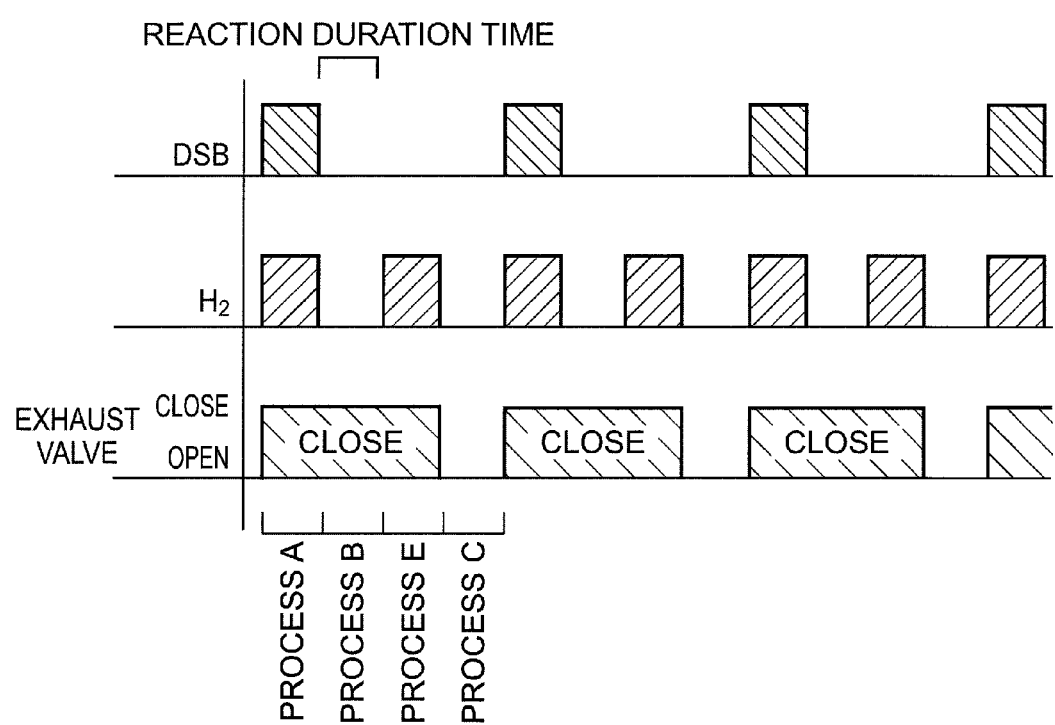
FIG. 5 is a diagram illustrating another example of the film forming sequence of the exemplary embodiment of the present invention.

In the present exemplary embodiment, an example in which process C is performed once whenever the cycle that includes process A and process B is performed three times is shown, but cycle C may be performed whenever the cycle that includes process A and process B is performed once. Here, as shown in FIG. 5, after process B is performed and before process C is performed, the hydrogen-containing gas may be supplied into the processing chamber 201 (process E). FIG. 5 shows an example in which $H_2$ gas is supplied as the hydrogen-containing gas in process E.

In this case, by performing a cycle that includes process A, process B, process E and process C by a predetermined number of times, the SiC film having a desired film thickness is formed on the wafer 200. The SiC film having the desired film thickness may be formed by performing the cycle once or plural times. In a case in which the desired film thickness is relatively thick, it is preferable to repeat the cycle plural times. In this case, a relatively thin SiC film may be formed per cycle and the thin SiC films may be then layered to form the SiC film having the desired film thickness. Even in a case in which a relatively thick SiC film is formed, it is possible to achieve excellent step coverage characteristics. FIG. 5 shows an example in which the cycle that includes process A, process B, process E and process C is repeated plural times. Further, FIG. 5 shows an example in which the supply time of the $H_2$ gas is the same as the supply time of the DSB gas in process A.

In this case, in process E, the $H_2$ gas is supplied, in a state in which the supply of the DSB gas is stopped, into the processing chamber 201 in which the reaction is performed to some extent by maintaining the state in which the DSB gas and the $H_2$ gas are confined in process B. The $H_2$ gas is preferably introduced with a desired flow rate in the range of 0.1 slm to 5 slm, for example. The supply time of the $H_2$ gas is set to a desired time of 1 second to 60 seconds, for example. Other processing conditions are the same as the processing conditions in process B.

Thus, the outermost surface of the wafer 200, that is, the outermost surface of the SiC film formed on the wafer 200 in process A and process B can be purged with the $H_2$ gas. Here, a part of the $H_2$ gas is thermally decomposed to slightly generate atomic hydrogen (H), and thus, the atomic hydrogen is slightly included in the $H_2$ gas. Further, due to the $H_2$ gas purge, it is possible to remove the DSB gas that is physically adsorbed on the outermost surface of the SiC film formed on the wafer 200 and does not react any more or is not likely to react. Further, due to the $H_2$ gas purge, it is possible to set the outermost surface of the SiC film after removal of the DSB gas to a hydrogen terminal state. Through these processes, it is possible to set the outermost surface of the SiC film that is a base of film formation in a subsequent cycle to a state in which an SiC film to be subsequently formed is easily grown.

Figure 6:
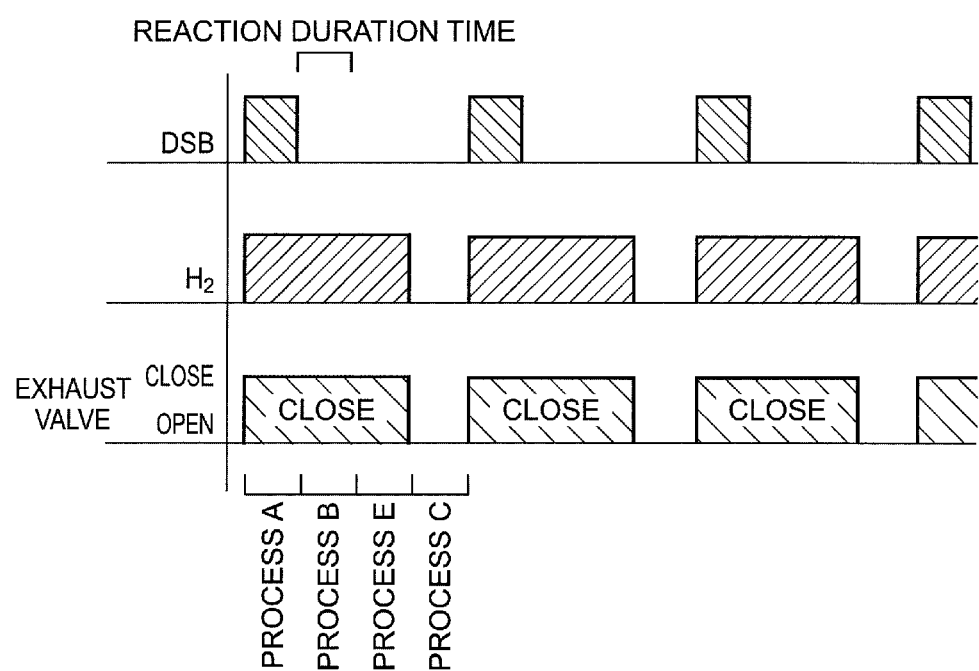
FIG. 6 is a diagram illustrating still another example of the film formation sequence according to an embodiment of the present invention.

Further, here, as shown in FIG. 6, in process B, the hydrogen-containing gas may be supplied into the processing chamber 201. That is, in process A to process E, the hydrogen-containing gas may be continuously supplied. FIG. 6 shows an example in which the $H_2$ gas is supplied as the hydrogen-containing gas in process B, that is, an example in which the $H_2$ gas is continuously supplied in process A to process E. In this way, by continuously supplying the $H_2$ gas in process A to process E, it is possible to supply the atomic hydrogen to be supplied due to reaction, and to enhance the reaction efficiency.

Further, in the present exemplary embodiment, an example in which the silicon carbide film (SiC film) is formed as the SiC-based film has been described, but by providing a process of supplying a nitrogen-containing gas and/or a process of supplying an oxygen-containing gas in the period when the supply of the DSB gas and the $H_2$ gas is stopped, as in process B, for example, it is possible to form at least one type of film among a silicon carbonitride film (SiCN film), a silicon oxycarbide film (SiOC film) and a silicon oxycarbonitride film (SiOCN film) as the SiC-based film.

Figure 7:
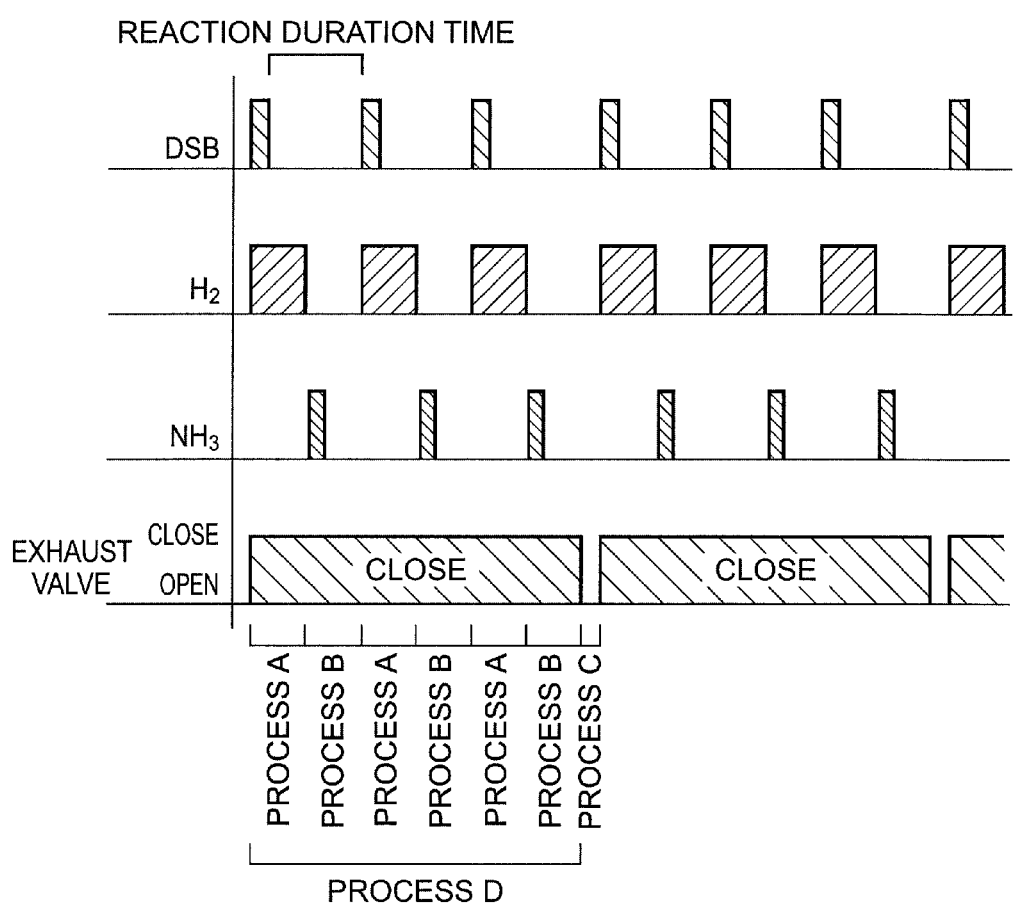
FIG. 7 is a diagram illustrating still another example of the film formation sequence according to an embodiment of the present invention.

For example, as shown in FIG. 7, by providing a process of supplying $NH_3$ gas, for example, as the nitrogen-containing gas in process B, it is possible to form the silicon carbonitride film (SiCN film) as the SiC-based film.

The nitrogen-containing gas is supplied into the processing chamber 201 from the fourth gas supply tube 232d through the mass flow controller 241d, the valve 243d and the fourth nozzle 249d.

Figure 8:
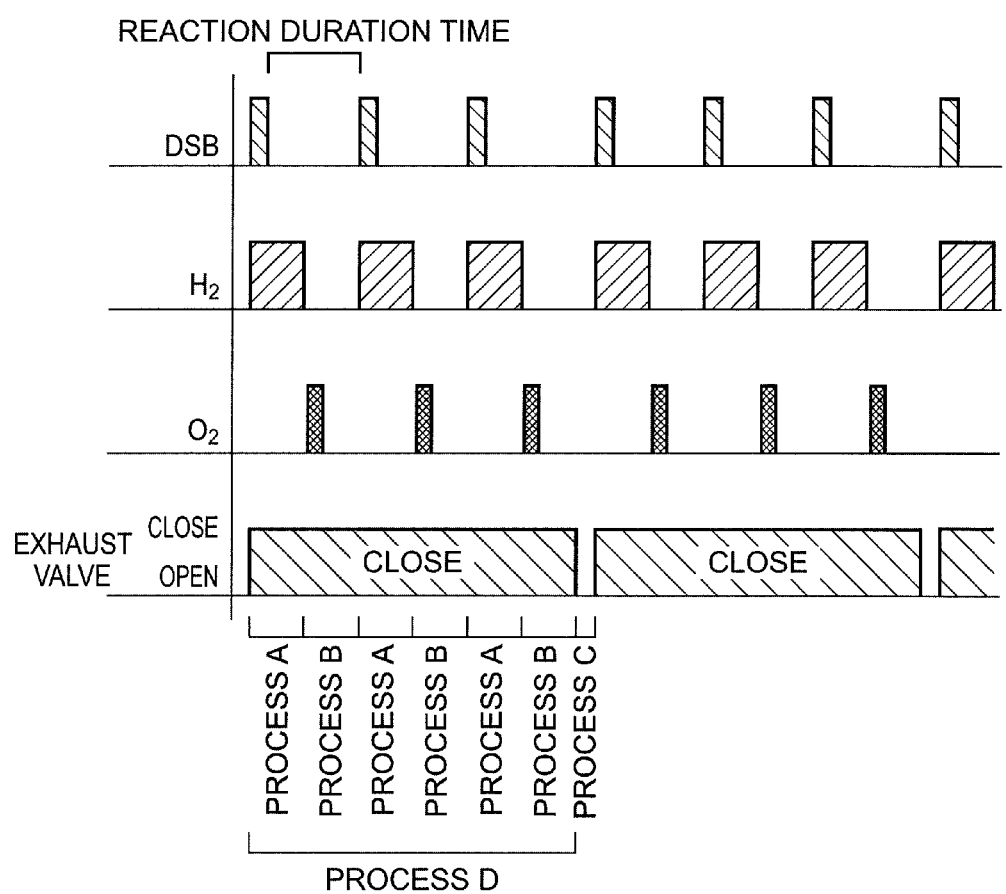
FIG. 8 is a diagram illustrating still another example of the film formation sequence according to an embodiment of the present invention.

Further, for example, as shown in FIG. 8, by providing a process of supplying $O_2$ gas, for example, as the oxygen-containing gas in process B, it is possible to form the SiOC film as the SiC-based film.

The oxygen-containing gas is supplied into the processing chamber 201 from the third gas supply tube 232c through the mass flow controller 241c, the valve 243c and the third nozzle 249c.

Figure 9:
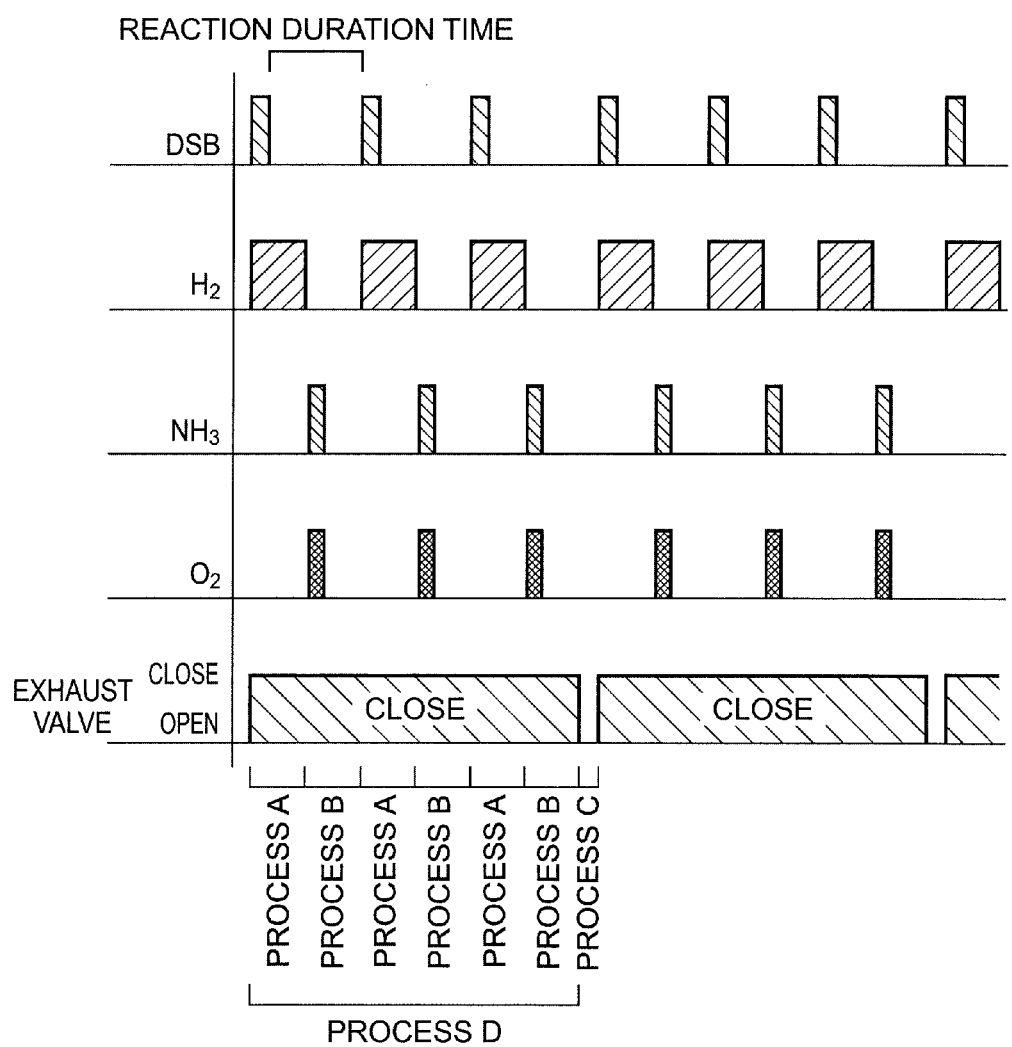
FIG. 9 is a diagram illustrating still another example of the film formation sequence according to an embodiment of the present invention.

Further, for example, as shown in FIG. 9, by providing a process of supplying the $NH_3$ gas, for example, as the nitrogen-containing gas and a process of supplying the $O_2$ gas, for example, as the oxygen-containing gas in process B, it is possible to form the SiOCN film as the SiC-based film.

In FIG. 9, the process of supplying the $NH_3$ gas and the process of supplying the $O_2$ gas are simultaneously performed, but the process of supplying the $NH_3$ gas may be performed before the process of supplying the $O_2$ gas, or the process of supplying the $O_2$ gas may be performed before the process of supplying the $NH_3$ gas.

In FIGS. 7, 8 and 9, the example in which in a period when the supply of the DSB gas and the $H_2$ gas is stopped as in process B or the like, the process of supplying the nitrogen-containing gas and/or the process of supplying the oxygen-containing gas is provided has been described, but by providing the process of supplying the nitrogen-containing gas and/ or the process of supplying the oxygen-containing gas in a period when the supply of the DSB gas and the $H_2$ gas is continued as in process A or the like, at least one type of film among the SiCN film, SiOC film and SiOCN film may be formed as the SiC-based film.

As an organosilicon-based source, for example, at least one type of source among organosilane sources such as $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$ and $Si_3C_2H_{10}$ may be preferably used. That is, as the organosilicon-based source, for example, in a case in which a carbon element is a single bond, it is possible to preferably use a source expressed as $Si_xC_yH_{2(x+y+1)}$ (here, x and y are integers of 1 or greater, respectively), and for example, in a case in which the carbon element is a double bond, it is possible to preferably use a source expressed as $Si_xC_{(y+1)}H_{2(x+y+1)}$ (here, x and y are integers of 1 or greater, respectively). These organosilane sources are configured only by three elements of silicon (Si), carbon (C) and hydrogen (H), do not include chlorine (Cl) and may be referred to as silane-based sources that do not contain "chloro". The organosilicon-based source acts as a silicon source and also acts as a carbon source when the SiC film is formed.

As the hydrogen-containing gas, for example, hydrogen ($H_2$) gas and ammonia ($NH_3$) gas, a hydrocarbon-based gas such as methane ($CH_4$) gas, diazene ($N_2H_2$) gas, hydrazine ($N_2H_4$) gas or $N_3H_8$ gas, or a silane-based gas such as $SiH_4$ or $Si_2H_6$ may be preferably used.

As the nitrogen-containing gas, for example, ammonia ($NH_3$) gas, diazene ($N_2H_2$) gas, hydrazine ($N_2H_4$) gas, $N_3H_8$ gas or the like may be preferably used. The nitrogen-containing gas acts as a nitrogen source when the SiCN film is formed. Since the nitrogen ($N_2$) gas is an inert gas and is not introduced into the SiC film, the nitrogen ($N_2$) gas is excluded from the nitrogen source.

Further, as the nitrogen-containing gas, an amine-based gas may be used. The amine-based gas is a gas that includes an amine group, and is a gas that includes at least carbon (C), nitrogen (N) and hydrogen (H). The amine-based gas includes amine such as ethylamine, methylamine, propylamine, isopropylamine, butylamine or isobutylamine. Here, the amine generally refers to a compound of a type obtained by replacing hydrogen atoms of ammonia ($NH_3$) with a hydrocarbon group such as an alkyl group. That is, the amine includes the hydrocarbon group such as an alkyl group. The amine-based gas may be referred to as a silicon non-containing gas since silicon (Si) is not included therein, and may also be referred to as a silicon and metal non-containing gas since silicon and metal are not included therein. As the amine-based gas, for example, an ethylamine-based gas such as triethylamine (($C_2H_5)_3N$, simply referred to as TEA), diethylamine (($C_2H_5)_2NH$, simply referred to as DEA) or monoethylamine ($C_2H_5NH_2$, simply referred to as MEA), a methylamine-based gas such as trimethylamine (($CH_3)_3N$, simply referred to as TMA), dimethylamine (($CH_3)_2NH$, simply referred to as DMA) or monomethylamine ($CH_3NH_2$, simply referred to as MMA), a propylamine-based gas such as tripropylamine (($C_3H_7)_3N$, simply referred to as TPA), dipropylamine (($C_3H_7)_2NH$, simply referred to as DPA), or monopropylamine ($C_3H_7NH_2$, simply referred to as MPA), an isopropylamine-based gas such as triisopropylamine ($[(CH_3)_2CH]_3N$, simply referred to as TIPA), diisopropylamine ($[(CH_3)_2CH]_2NH$, simply referred to as DIPA) or monoisopropylamine (($CH_3)_2CHNH_2$, simply referred to as MIPA), a butylamine-based gas such as tributylamine (($C_4H_9)_3N$, simply referred to as TBA), dibutylamine (($C_4H_9)_2NH$, simply referred to as DBA) or monobutylamine ($C_4H_9NH_2$, simply referred to as MBA), or an isobutylamine-based gas such as triisobutylamine ($[(CH_3)_2CHCH_2]_3N$, simply referred to as TIBA), diisobutylamine ($[(CH_3)_2CHCH_2]_2NH$, simply referred to as DIBA) or monoisobutylamine (($CH_3)_2CHCH_2NH_2$, simply referred to as MIBA) may be preferably used. That is, as the amine-based gas, for example, at least one type of gas among $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (here, x is an integer of 1 to 3) may be preferably used. The amine-base gas acts as the nitrogen source and also acts as the carbon source when the SiCN film is formed. By using the amine-based gas as the nitrogen-containing gas, it is easy to perform control in a direction where the ratio of the carbon component in the SiCN film is increased, and thus, it is possible to form an SiCN film having a relatively large amount of carbon component, that is, a carbon rich SiCN film.

As the oxygen-containing gas, for example, oxygen ($O_2$) gas, nitrous oxide ($N_2O$) gas, nitric monoxide (NO) gas, nitrogen dioxide ($NO_2$) gas, ozone ($O_3$) gas, hydrogen ($H_2$) gas+$O_2$ gas, $H_2$ gas+$O_3$ gas, vapor ($H_2O$) gas, carbon monoxide (CO) gas, carbon dioxide ($CO_2$) gas or the like may be preferably used.

Further, in the present exemplary embodiment, an example in which the SiC-based film is formed using the DSB gas and the $H_2$ gas has been described, and it is possible to omit the usage of the $H_2$ gas. That is, by using only the DSB gas, it is possible to form the SiC-based film. Further, by using only the DSB gas diluted with an inert gas such as $N_2$, it is possible to form the SiC-based film.

Figure 10:
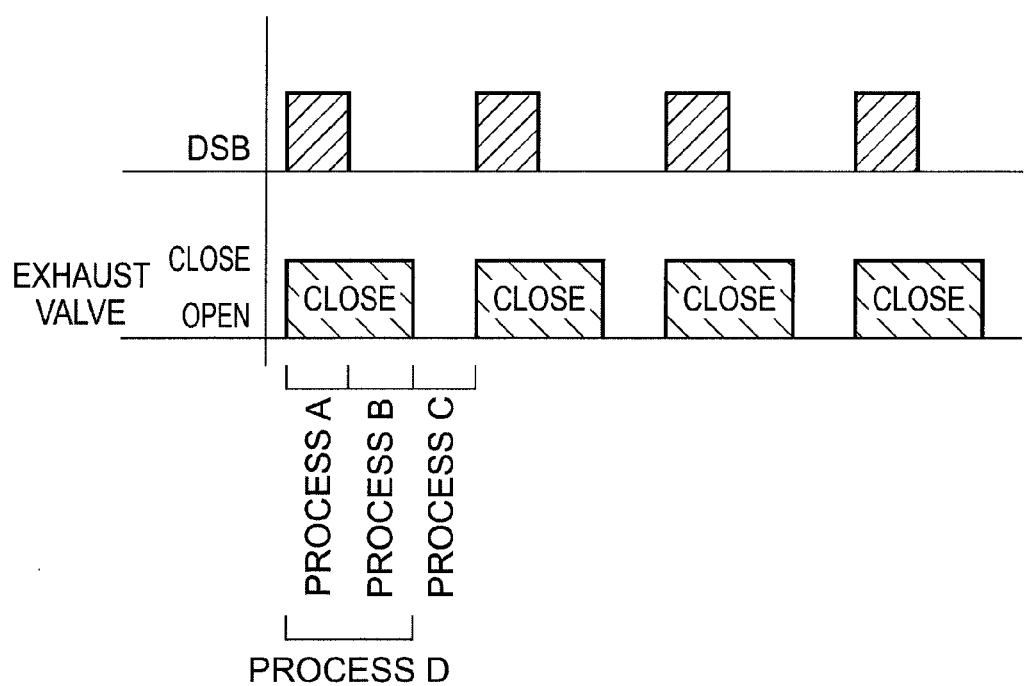
FIG. 10 is a diagram illustrating still another example of the film formation sequence according to an embodiment of the present invention.

For example, as shown in FIG. 10, only the DSB gas or the DSB gas diluted with the inert gas may supplied into the processing chamber to be confined in process A, this state may be maintained in process B, the inside of the processing chamber may be exhausted in process C, and a cycle that includes process A, process B and process C is performed by a predetermined number of times, to form the SiC film as the SiC-based film. In this case, a cycle that includes process (process D) of performing process A and process B by a predetermined number of times and process C may be performed by a predetermined number of times. Here, the processing condition may be set as the same processing condition when the DSB gas and the $H_2$ gas are used. FIG. 10 shows an example in which the cycle that includes process (process D) of performing process A and process B once, and process C is performed plural times.

In this way, even though only the DSB gas without using the $H_2$ gas or only the DSB gas diluted with the inert gas is used, it is confirmed that it is possible to form an SiC film having a practical level of flatness, film thickness uniformity and step coverage. However, in a case in which the DSB gas and the $H_2$ gas are used, particularly in a case in which film formation is performed with respect to a deeper trench or via, that is, a trench or via of a high aspect ratio, it is possible to form an SiC film having higher flatness, more excellent film thickness uniformity and more excellent step coverage.

Hereinbefore, the variety of typical exemplary embodiments of the invention have been described, but the invention is not limited to these exemplary embodiments.

For example, in the present exemplary embodiment, the example in which the supply of each gas is stopped in process B has been described, but the inert gas such as $N_2$ gas may continuously flow in each nozzle in process B. In this case, the inert gas is supplied into the processing chamber to increase the pressure inside the processing chamber, but by controlling the flow rate of the inert gas supplied into each nozzle, the pressure inside the processing chamber is controlled not to exceed the processing pressure, that is, the desired pressure in the range of 200 Pa to 5000 Pa. By causing the inert gas to continuously flow in each nozzle in process B, it is possible to prevent a film including silicon or carbon from being formed in each nozzle.

Figure 11:
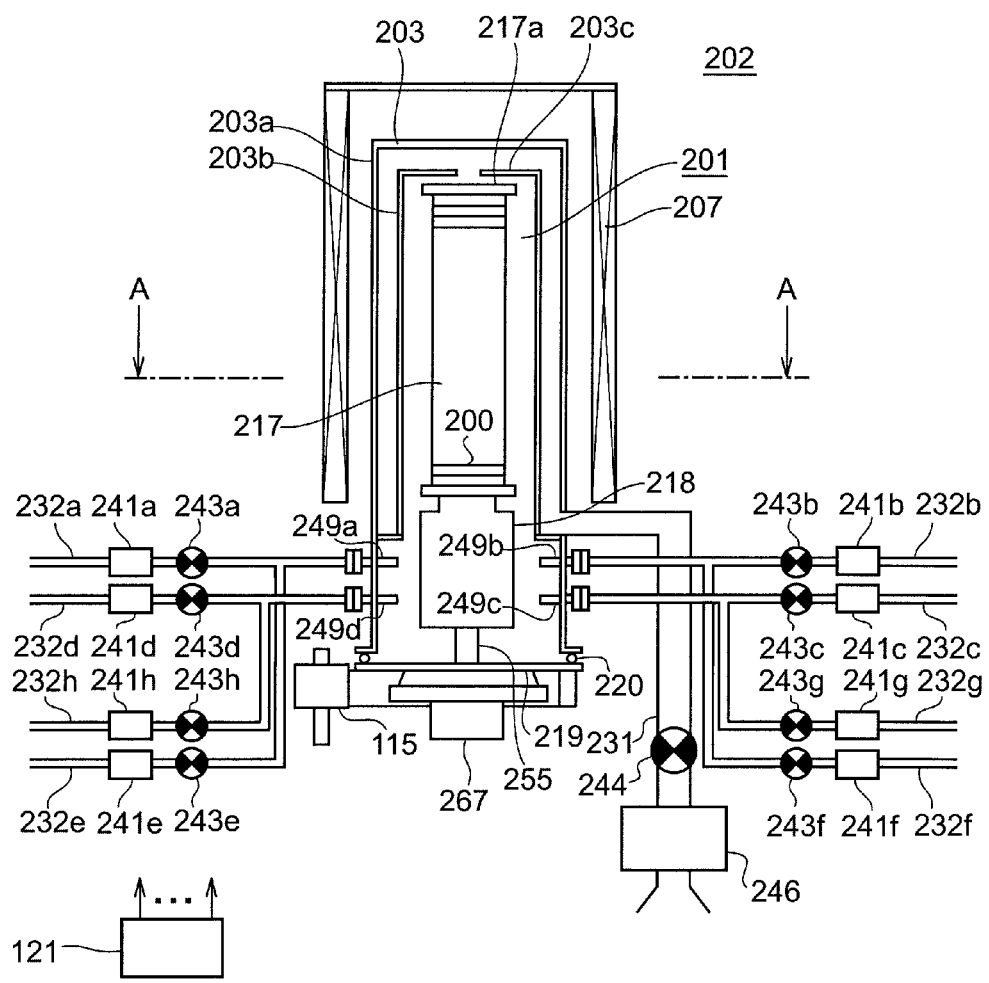
FIG. 11 is a diagram illustrating a schematic configuration of a vertical processing furnace of another substrate processing apparatus which is preferably used in an exemplary embodiment of the present invention, in which a processing furnace part is shown in a vertical cross-sectional view.

Further, for example, in the present exemplary embodiment, the example in which the processing chamber 201 having the structure of a single reaction tube has been described, but the invention is not limited thereto, and may be preferably applied to a case where the processing chamber 201 having the structure of a double reaction tube. In this case, as shown in FIG. 11, the reaction tube 203 is configured by an outer tube 203a as an outer reaction tube and an inner tube 203b as an inner reaction tube that is installed inside the outer tube, in which the organosilicon-based gas or the organosilicon-based gas and the hydrogen-containing gas flow into the processing chamber 201 formed in a hollow part in the inner tube 203b toward an upper end side of the inner tube 203b from a lower end side thereof, flow out to a cylindrical space between the inner tube 203b and the outer tube 203a from the upper end side of the inner tube 203b, and flow down in the cylindrical space to be then exhausted from an exhaust pipe 231. In this case, in a similar way to the above-described exemplary embodiment, by adjusting the opening level of the APC valve 244 installed in the exhaust pipe 231, the above-mentioned confined state is formed and maintained. In FIG. 11, the same reference numerals are given to substantially the same elements as the elements described with reference to FIG. 1, and its description will be omitted.

In this way, by using the processing chamber 201 of the double reaction tube structure, it is possible to form an SiC-based film having excellent flatness and film thickness uniformity.

In this case, it is preferable to have a structure in which an extension 203c that extends inward is formed in the upper end part of the inner tube 203b and at least a part of an upper end surface (top plate) 217a of the boat 217 is covered by the extension 203c. The extension 203c may cover at least a part of the front surface of the wafer 200. Further, it is preferable that the extension 203c be provided in parallel with an upper end surface 217a of the boat 217, that is, in parallel with the front surface of the wafer 200.

In this way, by providing the structure in which the extension 203c is formed in the upper end part of the inner tube 203b and at least the part of the upper end surface 217a of the boat 217 is covered by the extension 203c, it is possible to reduce the substantial volume of the processing chamber 201, to reduce the area where the organosilicon-based gas is thermally decomposed to generate reactive species, and to suppress the generation of various reactive species. Further, due to the structure of covering the upper part of the wafer 200, it is possible to suppress the reactive species generated in the upper part of the wafer 200 or generated between the outer tube 203a and the inner tube 203b from being in contact with the wafer 200. Due to this structure, it is possible to suppress the influence of the reactive species on the film thickness and film properties, and to realize uniform film thickness and film properties in the wafer plane and between the wafer planes.

Figure 12:
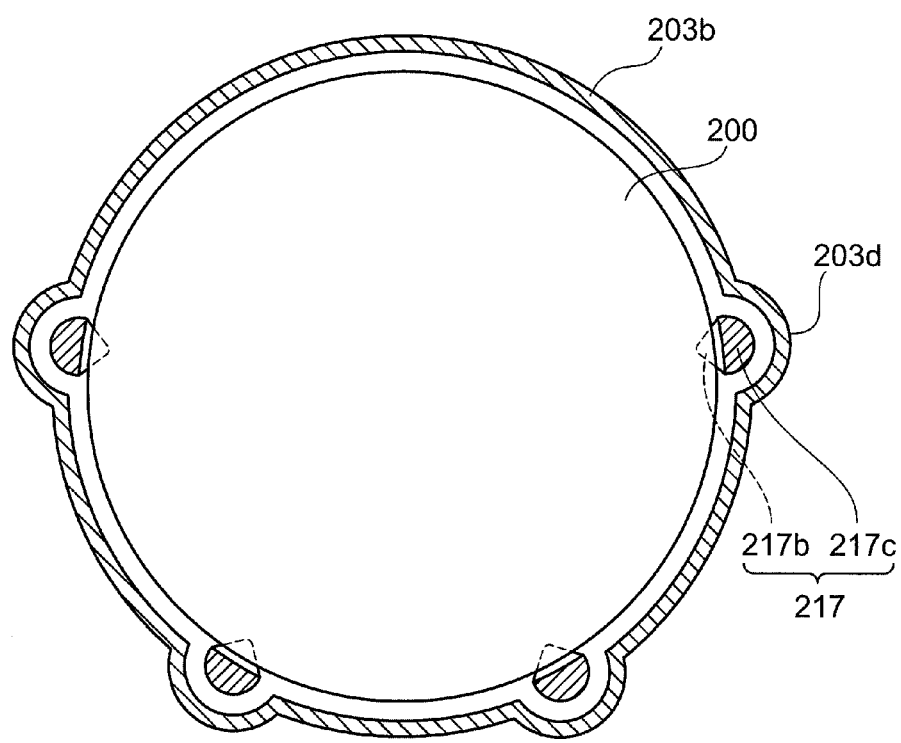
FIG. 12 is a diagram illustrating a schematic configuration of a vertical processing furnace of another substrate processing apparatus which is preferably used in an exemplary embodiment of the present invention, in which a processing furnace part is shown in a cross-sectional view taken along line A-A in FIG. 11, and is a cross-sectional view illustrating partial extraction of only an inner tube, a board and a wafer.

Further, in this case, it is preferable to shorten the distance between the inner wall of the inner tube 203b and the edge part of the wafer 200. Here, the boat 217 includes a boat support 217c in which an engaging groove 217b that supports the wafer 200 is formed. The boat support 217c is positioned outside the wafer 200. Thus, when the distance between the inner wall of the inner tube 203b and the edge part of the wafer 200 is shortened, the inner wall of the inner tube 203b and the boat support 217c are in contact with each other, and thus, it is difficult to further shorten the distance between the inner wall of the inner tube 203b and the edge part of the wafer 200. That is, the boat support 217c hinders the distance between the inner wall of the inner tube 203b and the edge part of the wafer 200 from being shortened. Thus, in order to further shorten the distance between the inner wall of the inner tube 203b and the edge part of the wafer 200, for example, as shown in FIG. 12, it is preferable to form a boat support groove 203d that is a space (concavity) for avoiding the part of the boat support 217c in a part of the inner wall of the inner tube 203b corresponding to the boat support 217c. FIG. 12 shows only the inner tube 203b, the boat 217, and the wafer 200, for ease of description.

Due to this structure, that is, the structure in which the concavity is formed to avoid the member that forms the boat 217 in the inner wall of the inner tube 203b, it is possible to extremely reduce the distance between the inner wall of the inner tube 203b and the edge part of the wafer 200.

In this way, by reducing the distance between the inner wall of the inner tube 203b and the edge part of the wafer 200, it is possible to reduce the substantial volume of the processing chamber 201, to reduce the area where reactive species are generated, and to suppress the generation of various reactive species. Further, due to this structure, it is possible to suppress the influence of the reactive species on the film thickness and film properties, and to realize uniform film thickness and film properties in the wafer plane and between the wafer planes.

Further, in this case, it is preferable to form a top surface (upper end surface) of the outer tube 203a as a plane. Further, it is preferable that the top surface be provided in parallel with the extension 203c of the upper end part of the inner tube 203b, that is, in parallel with the upper end surface 217a of the boat 217, that is, in parallel with the plane of the wafer 200. In order to secure the strength of the outer tube 203a, it is preferable to set the thickness of the top surface of the outer tube 203a to be thicker than the other parts, for example, the wall part of the outer tube 203a.

In this way, by forming the top surface of the outer tube 203a as a plane, it is possible to reduce the substantial volume of the processing chamber 201, to reduce the area where reactive species are generated, and to suppress the generation of various reactive species. Further, due to this structure, it is possible to suppress the influence of the reactive species on the film thickness and film properties, and to realize uniform film thickness and film properties in the wafer plane and between the wafer planes.

Further, for example, in the above-described exemplary embodiment, an example in which a ladder boat (boat of a type in which an engaging groove is formed in a boat support) is used as a substrate support tool that supports the substrate has been described, but the invention is not limited thereto, and may be preferably applied to a case in which a ring boat is used. In this case, for example, the ring boat may include three or four boat supports that are disposed at appropriate intervals in a circumferential direction, and a ring-shaped holder as a support plate that is horizontally installed to the boat supports at multi stages and supports the outer circumference of the substrate from the rear surface. In this case, the ring-shaped holder may include a ring-shaped plate that has an outer diameter larger than the diameter of the substrate and an inner diameter smaller than the diameter of the substrate, and plural substrate holding hooks that are disposed at appropriate intervals in the circumferential direction on the ring-shaped plate and hold an outer circumferential rear surface of the substrate. Further, in this case, the ring-shaped holder may include a ring-shaped plate that has an outer diameter and an inner diameter larger than the diameter of the substrate, and plural substrate holding hooks that are disposed at appropriate intervals in the circumferential direction on the inner side of the ring-shaped plate and hold the outer circumferential rear surface of the substrate. Compared with a case in which the ring-shaped plate is not present, since the distance to a separated region (in this case, region divided in the ring-shaped plate) for each substrate from the hole of each nozzle is shortened as the ring-shaped plate is present, the gas ejected from each nozzle is easily transported to the substrate region. Thus, it is possible to sufficiently secure the gas supply amount to the substrate, and to prevent reduction in the film forming rate or deterioration of uniformity. By using the ring boat, it is possible to form an SiC-based film having excellent flatness and film thickness uniformity.

Further, in the above-described exemplary embodiments, an example has been described in which the silicon-based insulation film (SiC film, SiCN film, SiOCN film and SiOC film) including silicon that is a semiconductor element is formed, but the invention may also be applied to a case in which a metal-based thin film including a metallic element such as titanium (Ti), zirconium (Zr), hafnium (Hf), tantalum (Ta), aluminum (Al) or molybdenum (Mo) is formed.

For example, the invention may also be preferably applied to a case in which a metal carbide film such as a titanium carbide film (TiC film), a zirconium carbide film (ZrC film), a hafnium carbide film (HfC film), a tantalum carbide film (TaC film), an aluminum carbide film (AlC film) or a molybdenum carbide film (MoC film) is formed.

Further, for example, the invention may also be preferably applied to a case in which a metal carbonitride film such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film) or a molybdenum carbonitride film (MoCN film) is formed.

Further, for example, the invention may also be preferably applied to a case in which a metal oxycarbonitride film such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film) or a molybdenum oxycarbonitride film (MoOCN film) is formed.

Further, for example, the invention may also be preferably applied to a case in which a metal oxycarbide film such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film) or a molybdenum oxycarbide film (MoOC film) is formed.

In this case, it is possible to perform film formation by the same sequence as that of the above-described exemplary embodiment, using an organic metal-based source gas that includes a metal element instead of the organosilicon-based source gas in the above-described exemplary embodiment. It is preferable that the organic metal-based source gas use a source that includes only three elements of a metal element, a carbon element and a hydrogen element. As the hydrogen-containing gas, the nitrogen-containing gas and the oxygen-containing gas, it is possible to use the same gases as those of the above-described exemplary embodiment. Here, processing conditions may be set to the same processing conditions as those of the above-described exemplary embodiment, for example.

That is, the invention may be preferably applied to a case in which a thin film that includes a predetermined element such as a semiconductor element or a metal element is formed.

Further, in the above-described exemplary embodiment, an example in which an SiC-based film is formed without using plasma has been described, but the invention is not limited thereto, and may be preferably applied to a case in which an SiC-based film is formed using plasma. In this case, at least one of the organosilicon-based gas and the hydrogen-containing gas is excited (activated) using plasma. Excitation of at least one of the organosilicon-based gas and the hydrogen-containing gas using plasma may be performed in the processing chamber 201 using direct plasma, or may be performed outside the processing chamber 201 using remote plasma.

Further, in the above-described exemplary embodiment, an example in which the SiC-based films are respectively formed using 7 types of film forming sequences has been described, but the invention is not limited thereto, and the 7 types of film forming sequences may be appropriately combined for use. For example, each of the film forming sequences in FIGS. 4, 5, 6 and 10 and each of the film forming sequences in FIGS. 7, 8 and 9 may be combined for use.

Further, for example, in the above-described exemplary embodiments, an example has been described in which the film is formed using a batch substrate processing apparatus that processes plural substrates at a time, but the invention is not limited thereto. That is, the invention may also be preferably applied to a case in which the film is formed using a single substrate processing apparatus that processes one sheet of substrate or several sheets of substrates at a time.

Further, the respective film forming examples or application examples of the above-described exemplary embodiments may be preferably used in combination.

Further, for example, the invention may also be realized when a process recipe of the existing substrate processing apparatus is changed. In a case in which the process recipe is changed, a process recipe according to the invention may be installed to the existing substrate processing apparatus through an electric communication line or a non-transitory computer-readable recording medium that records the process recipe according to the invention, and the process recipe of the existing substrate processing apparatus may be changed to the process recipe according to the invention by operating an input and output device of the existing substrate processing apparatus.

EXAMPLES

Example 1

The SiC film is formed on the wafer 200 as an evaluation sample, by the film forming sequence according to the exemplary embodiment of the invention, described with reference to FIG. 4. Here, the temperatures of the processing chamber 201 and the wafer 200 are set to 425° C., the supply amount of materials, that is, the supply flow rate of the materials and the supply time thereof are respectively set with respect to a volume 100 L of the processing chamber 201 as follows. That is, the supply flow rate and the supply time of the $H_2$ gas are respectively set to 0.20 slm and 40 seconds, and the supply flow rate and the supply time of the DSB gas are respectively set to 0.10 slm and 20 seconds. Other processing conditions in each process are set to conditions within the processing condition range described in the above exemplary embodiment. Further, the concentrations of silicon (Si), carbon (C) and oxygen (O) in the SiC film in the evaluation samples are measured by X-ray Photoelectron Spectroscopy (XPS).

Figure 13:
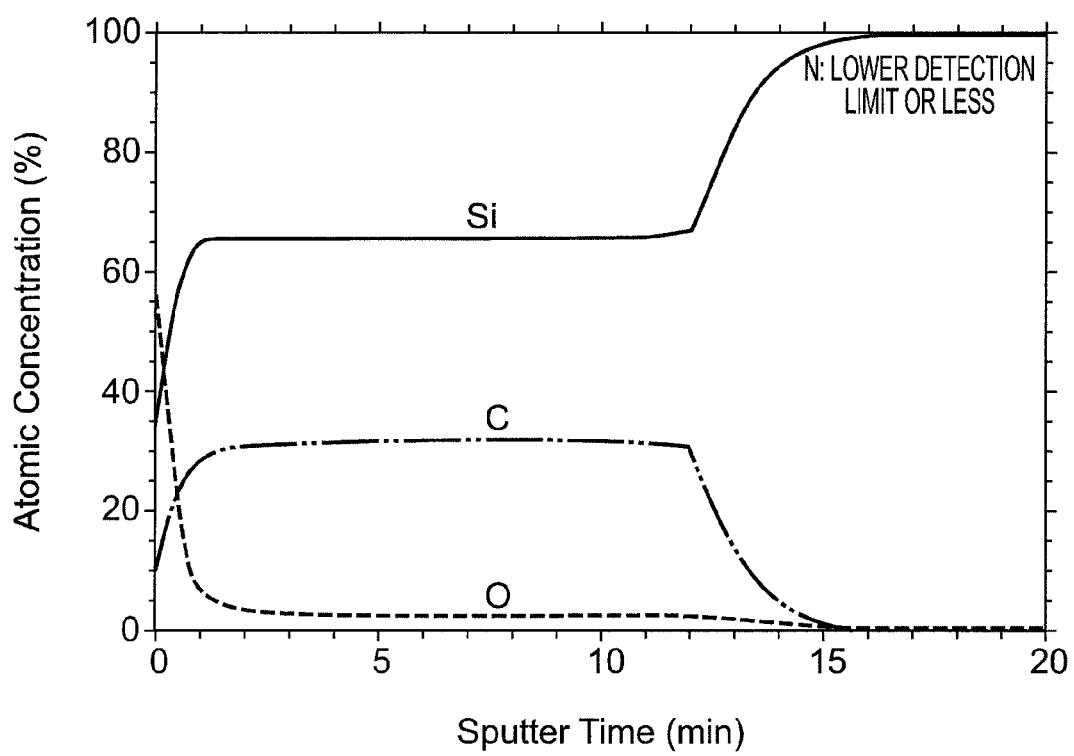
FIG. 13 is a diagram illustrating depth directional profiles of the concentrations of silicon (Si), carbon (C) and oxygen (O) in an SiC film formed in Example 1 of the present invention.

The result is shown in FIG. 13. FIG. 13 is a diagram illustrating depth directional profiles of the concentrations of respective atoms, in which the horizontal axis represents sputtering time (minute) (the same as the depth) and the vertical axis represents the concentrations (%) of the respective atoms in the film.

It can be understood from FIG. 13 that an SiC film having the atomic concentration of carbon of approximately 30% is formed. Further, it can be also understood that the atomic concentration of oxygen in the SiC film is lower than 3%, which is at the impurity level. Further, according to other experiments performed by the inventors, it is confirmed that it is possible to perform a control so that the atomic concentration of carbon in the SiC film is 25% to 35%, for example, according to the film forming sequence in the exemplary embodiment of the invention.

Example 2

The SiC film is formed on the wafer 200 having a trench of an aspect ratio of about 4 to 5 on a front surface as an evaluation sample, by the film forming sequence according to the exemplary embodiment of the invention, described with reference to FIG. 4. Here, the temperatures of the processing chamber 201 and the wafer 200 are set to 425° C., the supply amount of materials, that is, the supply flow rate of the materials and the supply time thereof are respectively set with respect to a volume 100 L of the processing chamber 201 as follows. That is, the supply flow rate and the supply time of the $H_2$ gas are respectively set to 0.20 slm and 40 seconds, and the supply flow rate and the supply time of the DSB gas are respectively set to 0.10 slm and 20 seconds. Other processing conditions in each process are set to conditions within the processing condition range described in the above exemplary embodiment. Further, a cross-sectional TEM image of the SiC film in the evaluation sample is observed and a step coverage is measured.

Figure 14:
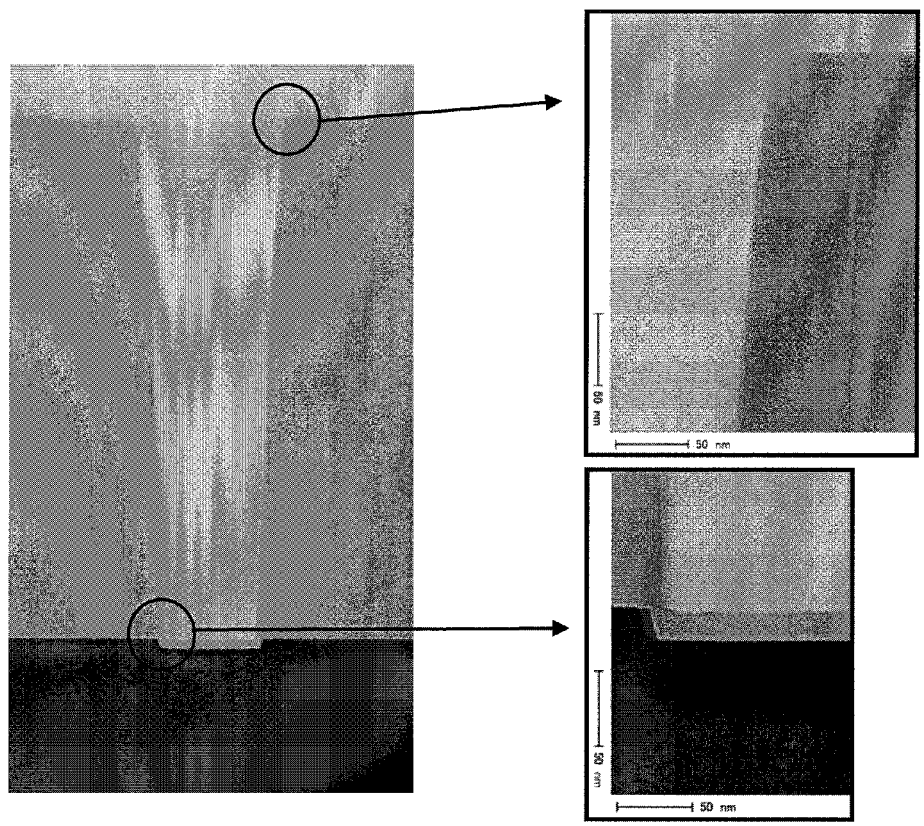
FIG. 14 is a diagram illustrating a cross-sectional TEM image of an SiC film formed in Example 2 of the present invention.

The TEM image is shown in FIG. 14. It can be understood from FIG. 14 that the SiC film having excellent flatness, film thickness uniformity and high step coverage with respect to the wafer 200 having a trench on the front surface is formed, according to the present exemplary embodiment. Here, the step coverage of the SiC film is approximately 85%. According to other experiments performed by the inventors, it is confirmed that it is possible to form an SiC film having a step coverage of approximately 80% to 95%, for example, according to the film forming sequence in the exemplary embodiment of the present invention.

Example 3

The SiC film is formed on the wafer 200 as an evaluation sample, by the film forming sequence according to the exemplary embodiment of the invention, described with reference to FIG. 4. Here, processing conditions in each process are set to conditions within the processing condition range described in the above exemplary embodiment. Further, as the evaluation sample, the same evaluation sample as in Example 1 is prepared. With respect to the SiC film in the evaluation sample, a wet etching evaluation using 1% HF solution is performed. As a result, it is confirmed that resistance having a wet etching rate of 1 Å/min or lower is obtained.

Example 4

The SiC film is formed on the wafer 200 as an evaluation sample, by the film forming sequence according to the exemplary embodiment of the invention, described with reference to FIG. 4. Here, processing conditions in each step are set to the same conditions as the conditions in the above-described exemplary embodiment. As the evaluation sample, the same sample as in Example 1 is prepared. With respect to the SiC film in the evaluation sample, plasma oxidation is performed. Before and after the plasma oxidation, the concentrations of silicon (Si), carbon (C), and oxygen (O) in the SiC film are measured by X-ray Fluorescence Analysis (XRF). As a result, it is confirmed that resistance of a level at which the outermost surface of the SiC film is naturally oxidized is obtained.

Example 5

By using only the DSB gas by the film forming sequence according to the exemplary embodiment of the invention, described with reference to FIG. 10, that is, without using $H_2$ gas, the SiC film is formed on the wafer 200 having a trench of an aspect ratio of about 4 to 5 on the front surface as an elevation sample. Here, the temperatures of the processing chamber 201 and the wafer 200 are set to 400° C. to 420° C., the pressure in the processing chamber at the time of confinement in process B is set to 200 Pa to 500 Pa. Other processing conditions in each process are set to conditions within the processing condition range described in the above exemplary embodiment. Further, a cross-sectional TEM image of the SiC film in the evaluation sample is observed and step coverage is measured.

As a result, according to the present embodiment, it is confirmed that the SiC film having excellent flatness, film thickness uniformity and high step coverage with respect to the wafer 200 having a trench on the front surface is formed. Here, the step coverage of the SiC film is approximately 80% to 90%. According to other experiments performed by the inventors, it is confirmed that it is possible to form an SiC film having a step coverage of approximately 80% to 95%, for example, according to the film forming sequence in the exemplary embodiment of the present invention.

PREFERRED ASPECTS OF THE INVENTION

Hereinafter, preferred aspects of the invention will be added.

(Addition 1)

According to an aspect of the present invention, there is provided a manufacturing method of a semiconductor device including:

accommodating a substrate in a processing chamber; and supplying an organosilicon-based gas into the processing chamber that is heated to form a film including silicon and carbon on the substrate, wherein in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

(Addition 2)

In the method according to Addition 1, preferably, in the forming of the film including silicon and carbon, the inside of the processing chamber is heated to a temperature at which the organosilicon-based gas is thermally decomposed.

(Addition 3)

In the method according to Addition 1 or 2, preferably, the forming of the film including silicon and carbon is performed under a non-plasma state.

(Addition 4)

In the method according to any one of Additions 1 to 3, preferably, in the forming of the film including silicon and carbon, alternately performing, a predetermined number of times, the confining of the organosilicon-based gas in the processing chamber and the maintaining of the state in which the organosilicon-based gas is confined in the processing chamber, and the exhausting of the inside of the processing chamber are alternately performed a predetermined number of times.

Here, the "alternately performing, the predetermined number of times, (A) the confining of the organosilicon-based gas in the processing chamber and (B) the maintaining of the state in which the organosilicon-based gas is confined in the processing chamber" includes, when (A) the confining of the organosilicon-based gas in the processing chamber and (B) the maintaining of the state in which the organosilicon-based gas is confined in the processing chamber are set as one cycle, both of a case in which the cycle is performed one time and a case in which the cycle is performed plural times (is repeated plural times), that is, which means that the cycle is performed one or more times (one time or plural times). Similarly, "the alternately performing, the predetermined number of times, (A) the confining of the organosilicon-based gas in the processing chamber and (B) the maintaining of the state in which the organosilicon-based gas is confined in the processing chamber, and (C) the exhausting of the inside of the processing chamber are alternately performed the predetermined number of times" includes, when the alternately performing, the predetermined number of times, (A) the confining of the organosilicon-based gas in the processing chamber and (B) the maintaining of the state in which the organosilicon-based gas is confined in the processing chamber, and (C) the exhausting of the inside of the processing chamber are set as one cycle, both of a case in which the cycle is performed one time and a case in which the cycle is performed plural times (is repeated plural times), that is, which means that the cycle is performed one or more times (one time or plural times).

(Addition 5)

In the method according to any one of Additions 1 to 3, preferably, in the forming of the film including silicon and carbon, the confining of the organosilicon-based gas in the processing chamber, the maintaining of the state in which the organosilicon-based gas is confined in the processing chamber and the exhausting of the inside of the processing chamber are set as one cycle, and the cycle is repeated plural times.

(Addition 6)

In the method according to any one of Additions 1 to 3, preferably, in the forming of the film including silicon and carbon, alternately repeating, plural times, the confining of the organosilicon-based gas in the processing chamber and the maintaining of the state in which the organosilicon-based gas is confined in the processing chamber, and the exhausting of the inside of the processing chamber are set as one cycle, and the cycle is repeated plural times.

(Addition 7)

In the method according to any one of Additions 1 to 6, preferably, in the confining of the organosilicon-based gas in the processing chamber, the organosilicon-based gas and a hydrogen-containing gas are confined in the processing chamber, and in the maintaining of the state in which the organosilicon-based gas is confined in the processing chamber, the state in which the organosilicon-based gas and the hydrogen-containing gas are confined in the processing chamber is maintained.

(Addition 8)

According to another aspect of the present invention, there is provided a method of manufacturing a semiconductor device including:

accommodating a substrate in a processing chamber; and supplying an organosilicon-based gas and a hydrogen-containing gas into the processing chamber that is heated to form a film including silicon and carbon on the substrate, wherein in the forming of the film including silicon and carbon, a cycle is performed a predetermined number of times, the cycle including supplying the organosilicon-based gas and the hydrogen-containing gas into the processing chamber and confining the organosilicon-based gas and the hydrogen-containing gas in the processing chamber, maintaining a state in which the organosilicon-based gas and the hydrogen-containing gas are confined in the processing chamber, and exhausting an inside of the processing chamber.

(Addition 9)

In the method according to any one of Additions 1 to 8, preferably, the cycle further includes supplying of a hydrogen-containing gas into the processing chamber.

(Addition 10)

In the method according to any one of Additions 1 to 9, preferably, in the forming of the film including silicon and carbon, the confining of the organosilicon-based gas and the hydrogen-containing gas in the processing chamber, the maintaining of the state in which the organosilicon-based gas and the hydrogen-containing gas are confined in the processing chamber, the supplying of the hydrogen-containing gas into the processing chamber, and the exhausting of the inside of the processing chamber are set as one cycle, and the cycle is performed a predetermined number of times.

(Addition 11)

In the method according to any one of Additions 1 to 9, preferably, in the forming of the film including silicon and carbon, the confining of the organosilicon-based gas and the hydrogen-containing gas in the processing chamber, the maintaining of the state in which the organosilicon-based gas and the hydrogen-containing gas are confined in the processing chamber, the supplying of the hydrogen-containing gas into the processing chamber, and the exhausting of the inside of the processing chamber are set as one cycle, and the cycle is performed plural times.

(Addition 12)

In the method according to any one of Additions 9 to 11, preferably, in the supplying of the hydrogen-containing gas into the processing chamber, the hydrogen-containing gas is supplied into the processing chamber after the state in which the organosilicon-based gas and the hydrogen-containing gas are confined in the processing chamber is maintained.

(Addition 13)

In the method according to any one of Additions 1 to 12, preferably, the organosilicon-based gas is constituted of silicon element, carbon element and hydrogen element.

(Addition 14)

In the method according to any one of Additions 1 to 12, preferably, the organosilicon-based gas is at least one type of gas among $Si_xC_yH_{2(x+y+1)}$ and $Si_xC_{(y+1)}H_{2(x+y+1)}$ (here, x and y are integers of 1 or greater).

(Addition 15)

In the method according to any one of Additions 1 to 12, preferably, the organosilicon-based gas is at least one type of gas among $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$ and $Si_3C_2H_{10}$.

(Addition 16)

In the method according to any one of Additions 1 to 15, preferably, in the forming of the film including silicon and carbon, the temperature of the substrate ranges from 350° C. to 500° C.

(Addition 17)

In the method according to Addition 17, preferably, in the forming of the film including silicon and carbon, by controlling any one of a period during which the state in which the organosilicon-based gas is confined in the processing chamber is maintained, the supply amount of the organosilicon-based gas and the temperature of the substrate, the atomic concentration of carbon in the film including silicon and carbon is controlled.

(Addition 18)

In the method according to Addition 17, preferably, in the forming of the film including silicon and carbon, by controlling any one of a period during which the state in which the organosilicon-based gas is confined in the processing chamber is maintained, the supply amount of the organosilicon-based gas and the temperature of the substrate, the atomic concentration of carbon in the film including silicon and carbon is controlled to be 25% to 35%.

(Addition 19)

In the method according to any one of Additions 1 to 18, preferably, in the confining of the organosilicon-based gas in the processing chamber and in the maintaining of the state in which the organosilicon-based gas is confined in the processing chamber, the exhaust of the inside of the processing chamber is stopped.

(Addition 20)

In the method according to any one of Additions 1 to 18, preferably, in the confining of the organosilicon-based gas in the processing chamber and in the maintaining of the state in which the organosilicon-based gas is confined in the processing chamber, the organosilicon-based gas is exhausted while being supplied into the processing chamber, and at this time, a state in which the exhaust rate of the organosilicon-based gas from the processing chamber is lower than the supply rate of the organosilicon-based gas into the processing chamber is maintained.

(Addition 21)

In the method according to any one of Additions 1 to 20, preferably, the film including silicon and carbon includes a silicon carbide film (SiC film).

(Addition 22)

In the method according to any one of Additions 1 to 20, preferably, the forming of the film including silicon and carbon further includes supplying a nitrogen-containing gas and/or supplying an oxygen-containing gas, and at least one type of film among a silicon carbonitride film (SiCN film), a silicon oxycarbide film (SiOC film) and a silicon oxycarbonitride film (SiOCN film) is formed as the film including silicon and carbon.

(Addition 23)

In the method according to any one of Additions 1 to 20, preferably, the forming of the film including silicon and carbon further includes supplying a nitrogen-containing gas, and a silicon carbonitride film (SiCN film) is formed as the film including silicon and carbon.

(Addition 24)

In the method according to any one of Additions 1 to 20, preferably, the forming of the film including silicon and carbon further includes supplying an oxygen-containing gas, and a silicon oxycarbide film (SiOC film) is formed as the film including silicon and carbon.

(Addition 25)

In the method according to any one of Additions 1 to 20, preferably, the forming of the film including silicon and carbon further includes supplying a nitrogen-containing gas and supplying an oxygen-containing gas, and a silicon oxycarbide film (SiOC film) or a silicon oxycarbonitride film (SiOCN film) is formed as the film including silicon and carbon.

(Addition 26)

According to still another aspect of the present invention, there is provided a method of manufacturing a semiconductor device including:

accommodating a substrate in a processing chamber; and supplying an organosilicon-based gas into the processing chamber that is heated to form a film including silicon and carbon on the substrate, wherein the forming of the film including silicon and carbon includes:

exhausting the organosilicon-based gas while supplying the organosilicon-based gas into the processing chamber and forming a state in which an exhaust rate of the organosilicon-based gas from the processing chamber is lower than a supply rate of the organosilicon-based gas into the processing chamber;

maintaining the state; and exhausting the inside of the processing chamber.

(Addition 27)

According to still another aspect of the present invention, there is provided a substrate processing method including:

accommodating a substrate in a processing chamber; and supplying an organosilicon-based gas into the processing chamber that is heated to form a film including silicon and carbon on the substrate, wherein in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

(Addition 28)

According to still another aspect of the present invention, there is provided a substrate processing apparatus including:

a processing chamber that accommodates a substrate;

a heater that heats an inside of the processing chamber;

an organosilicon-based gas supply system that supplies an organosilicon-based gas into the processing chamber;

an exhaust system that exhausts the inside of the processing chamber; and a control section configured to control the heater, the organosilicon-based gas supply system and the exhaust system so as to perform supplying the organosilicon-based gas into the processing chamber that accommodates the substrate and is heated to form a film including silicon and carbon on the substrate, and at this time, so as to perform a cycle a predetermined number of times, the cycle including supplying the organosilicon-based gas into the processing chamber and confining the organosilicon-based gas in the processing chamber, maintaining a state in which the organosilicon-based gas is confined in the processing chamber, and exhausting the inside of the processing chamber.

(Addition 29)

According to still another aspect of the invention, there is provided a program that causes a computer to perform process including:

accommodating a substrate in a processing chamber of a substrate processing apparatus; and supplying an organosilicon-based gas into the processing chamber that is heated to form a film including silicon and carbon on the substrate, wherein in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber, and exhausting an inside of the processing chamber.

(Addition 30)

According to still another aspect of the present invention, there is provided a non-transitory computer-readable medium storing a program that causes a computer to perform a process including:

accommodating a substrate in a processing chamber of a substrate processing apparatus; and supplying an organosilicon-based gas into the processing chamber that is heated to form a film including silicon and carbon on the substrate, wherein in the forming of the film including silicon and carbon, a cycle is performed a predetermined number of times, the cycle including supplying the organosilicon-based gas into the processing chamber and confining the organosilicon-based gas in the processing chamber, maintaining a state in which the organosilicon-based gas is confined in the processing chamber and exhausting an inside of the processing chamber.

As stated above, although various typical embodiments of the present invention have been described, the present invention is not limited to these embodiments. Therefore, the invention is intended to be limited only by the appended claims.

What is claimed is:

1. A method of manufacturing a semiconductor device comprising:

accommodating a substrate in a processing chamber; and supplying an organosilicon-based gas into the processing chamber, which is heated, to form a film including silicon and carbon on the substrate, wherein in the forming of the film including silicon and carbon, a cycle is performed a predetermined number of times, the cycle including alternately performing the following (a) and (b):

(a) alternately performing a predetermined number of times:

(a-1) supplying the organosilicon-based gas into the processing chamber and confining the organosilicon-based gas in the processing chamber, and (a-2) maintaining a state in which the organosilicon-based gas is confined in the processing chamber, and (b) exhausting an inside of the processing chamber.

2. The method according to claim 1, wherein in the forming of the film including silicon and carbon, the inside of the processing chamber is heated to a temperature at which the organosilicon-based gas is thermally decomposed.

3. The method according to claim 1, wherein the forming of the film including silicon and carbon is performed under a non-plasma state.

4. A method of manufacturing a semiconductor device comprising:

accommodating a substrate in a processing chamber;

supplying an organosilicon-based gas into the processing chamber, which is heated, to form a film including silicon and carbon on the substrate, wherein in the forming of the film including silicon and carbon, the following (a) and (b) are set as one cycle, and the cycle is repeated plural times:

(a) alternately repeating, plural times:

(a-1) supplying the organosilicon-based gas into the processing chamber and confining the organosilicon-based gas in the processing chamber and (a-2) maintaining a state in which the organosilicon-based gas is confined in the processing chamber, and (b) exhausting an inside of the processing chamber.

5. The method according to claim 1, wherein the cycle further includes supplying a hydrogen-containing gas into the processing chamber.

6. The method according to claim 1, wherein in the confining of the organosilicon-based gas in the processing chamber, the organosilicon-based gas and a hydrogen-containing gas are confined in the processing chamber, and in the maintaining of the state in which the organosilicon-based gas is confined in the processing chamber, the state in which the organosilicon-based gas and the hydrogen-containing gas are confined in the processing chamber is maintained.

7. The method according to claim 1, wherein the organosilicon-based gas is constituted of silicon, carbon and hydrogen.

8. The method according to claim 1, wherein the organosilicon-based gas is at least one type of gas selected from the group consisting of $Si_xC_yH_{2(x+y+1)}$ and $Si_xC_{(y+1)}H_{2(x+y+1)}$, wherein (x and y are integers of 1 or greater.

9. The method according to claim 1, wherein the organosilicon-based gas is at least one type of gas selected from the group consisting of $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$ and $Si_3C_2H_{10}$.

10. The method according to claim 1, wherein in the forming of the film including silicon and carbon, the temperature of the substrate ranges from 350° C. to 500° C.

11. The method according to claim 1, wherein in the confining of the organosilicon-based gas in the processing chamber and in the maintaining of the state in which the organosilicon-based gas is confined in the processing chamber, the exhaust of the inside of the processing chamber is stopped.

12. The method according to claim 1, wherein in the confining of the organosilicon-based gas in the processing chamber and in the maintaining of the state in which the organosilicon-based gas is confined in the processing chamber, the organosilicon-based gas is exhausted while being supplied into the processing chamber, and at this time, a state in which the exhaust rate of the organosilicon-based gas from the inside of the processing chamber is lower than the supply rate of the organosilicon-based gas into the processing chamber is maintained.

13. The method according to claim 1, wherein the film including silicon and carbon includes a silicon carbide film.

14. The method according to claim 1, wherein:

the forming of the film including silicon and carbon further includes at least one of supplying of a nitrogen-containing gas or supplying of an oxygen-containing gas; and at least one type of film selected from the group consisting of a silicon carbonitride film, a silicon oxycarbide film and a silicon oxycarbonitride film is formed as the film including silicon and carbon.

15. A substrate processing method comprising:
accommodating a substrate in a processing chamber; and
supplying an organosilicon-based gas into the processing chamber, which is heated, to form a film including silicon and carbon on the substrate, wherein
in the forming of the film including silicon and carbon, a cycle is performed a predetermined number of times, the cycle including alternately performing the following (a) and (b):
(a) alternately performing a predetermined number of times:
   (a-1) supplying the organosilicon-based gas into the processing chamber and confining the organosilicon-based gas in the processing chamber, and
   (a-2) maintaining a state in which the organosilicon-based gas is confined in the processing chamber, and
(b) exhausting an inside of the processing chamber.

16. A substrate processing apparatus comprising:
a processing chamber that accommodates a substrate;
a heater that heats an inside of the processing chamber;
an organosilicon-based gas supply system that supplies an organosilicon-based gas into the processing chamber;
an exhaust system that exhausts the inside of the processing chamber; and
a control section configured to control the heater, the organosilicon-based gas supply system and the exhaust system so as to perform supplying the organosilicon-based gas into the processing chamber that accommodates the substrate and is heated to form a film including silicon and carbon on the substrate, and at this time, so as to perform a cycle a predetermined number of times, the cycle including alternately performing the following (a) and (b):
(a) alternately performing a predetermined number of times:
   (a-1) supplying the organosilicon-based gas into the processing chamber and confining the organosilicon-based gas in the processing chamber, and
   (a-2) maintaining a state in which the organosilicon-based gas is confined in the processing chamber, and
(b) exhausting an inside of the processing chamber.

17. A non-transitory computer-readable medium storing a program that causes a computer to perform a process including:
accommodating a substrate in a processing chamber of a substrate processing apparatus; and
supplying an organosilicon-based gas into the processing chamber, which is heated, to form a film including silicon and carbon on the substrate, wherein
in the forming of the film including silicon and carbon, a cycle is performed a predetermined number of times, the cycle including alternately performing the following (a) and (b):
(a) alternately performing a predetermined number of times:
   (a-1) supplying the organosilicon-based gas into the processing chamber and confining the organosilicon-based gas in the processing chamber, and
   (a-2) maintaining a state in which the organosilicon-based gas is confined in the processing chamber, and
(b) exhausting an inside of the processing chamber.

* * * * *